United States Patent
Kim et al.

(10) Patent No.: US 11,735,084 B2
(45) Date of Patent: *Aug. 22, 2023

(54) DISPLAY DEVICE PREVENTING A COMMON VOLTAGE DROP AND MINIMIZING A BEZEL

(71) Applicant: Samsung Display Co., Ltd., Yongin-si (KR)

(72) Inventors: Tae Hoon Kim, Cheonan-si (KR); Won Kyu Kwak, Seongnam-si (KR); Han-Sung Bae, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/714,675

(22) Filed: Apr. 6, 2022

(65) Prior Publication Data

US 2022/0230574 A1    Jul. 21, 2022

Related U.S. Application Data

(63) Continuation of application No. 16/852,356, filed on Apr. 17, 2020, now Pat. No. 11,322,065.

(30) Foreign Application Priority Data

Apr. 18, 2019    (KR) .................. 10-2019-0045420

(51) Int. Cl.
*G09G 3/20*    (2006.01)
(52) U.S. Cl.
CPC ....... *G09G 3/20* (2013.01); *G09G 2310/0275* (2013.01); *G09G 2330/028* (2013.01)

(58) Field of Classification Search
CPC ..... G09G 2330/028; G09G 2310/0275; G09G 3/20
See application file for complete search history.

(56) References Cited

U.S. PATENT DOCUMENTS

| | | | |
|---|---|---|---|
| 11,322,065 B2* | 5/2022 | Kim ................. | G09G 3/20 |
| 2014/0111116 A1 | 4/2014 | Shin et al. | |
| 2014/0184964 A1 | 7/2014 | Byeon et al. | |
| 2016/0104757 A1 | 4/2016 | Kim et al. | |

(Continued)

FOREIGN PATENT DOCUMENTS

| | | |
|---|---|---|
| KR | 10-0573132 B1 | 4/2006 |
| KR | 10-2008-0047710 A | 5/2008 |

(Continued)

OTHER PUBLICATIONS

European Search Report corresponding to European Patent Application No. 20170247.9 dated Jul. 13, 2020 9 pages.

*Primary Examiner* — Nelson M Rosario
*Assistant Examiner* — Scott D Au
(74) *Attorney, Agent, or Firm* — Innovation Counsel LLP

(57) ABSTRACT

A display device includes: a substrate including a display area and a non-display area; an external common voltage line disposed in the non-display area; a plurality of pixels and a common voltage line disposed in the display area; and a driving voltage line connected to each of the plurality of pixels, wherein a subset of the plurality of pixels overlaps the common voltage line in the display area in a plan view, and the external common voltage line and the common voltage line are connected to each other.

21 Claims, 17 Drawing Sheets

(56) References Cited

U.S. PATENT DOCUMENTS

| | | |
|---|---|---|
| 2016/0232838 A1 | 8/2016 | Seo |
| 2016/0293677 A1 | 10/2016 | Oooka et al. |
| 2017/0179212 A1 | 6/2017 | Kwon et al. |
| 2019/0096975 A1 | 3/2019 | Park et al. |
| 2019/0237494 A1 | 8/2019 | Bae et al. |

FOREIGN PATENT DOCUMENTS

| | | |
|---|---|---|
| KR | 10-1497538 B1 | 3/2015 |
| KR | 10-2015-0075633 A | 7/2015 |
| KR | 10-2017-0081074 A | 7/2017 |

\* cited by examiner

DISPLAY DEVICE PREVENTING A COMMON VOLTAGE DROP AND MINIMIZING A BEZEL

CROSS-REFERENCE TO RELATED APPLICATION

This application is a continuation of U.S. patent application Ser. No. 16/852,356 filed on Apr. 17, 2020, which claims priority to and the benefit of Korean Patent Application No. 10-2019-0045420 filed in the Korean Intellectual Property Office on Apr. 18, 2019, the disclosure of which is incorporated herein by reference in its entirety.

BACKGROUND

(a) Technical Field

The present disclosure relates to a display device, particularly to a display device connecting a common voltage line of a non-display area inside a display area.

(b) Description of the Related Art

A display device displays an image. Recently, an emissive display device has attracted attention as a self-emitting display.

The emissive display device has a self-emission characteristic, and unlike a liquid crystal display, a separate light source is not required, so a thickness and a weight of the emissive display device may be reduced. Further, the emissive display device exhibits high-quality characteristics such as low power consumption, high luminance, and high reaction speed.

In general, the emissive display device may include a substrate, a plurality of thin film transistors disposed on the substrate, a plurality of insulating layers disposed between wires configuring the thin film transistors, and a light-emitting element connected to the thin film transistor. An organic light emitting element may be an example of the light-emitting element.

On the other hand, as a bezel of the display device becomes thinner, a user's line of sight may be fixed or focused on an image (or a screen of the display device). In recent years, a whole-surface display technology has been developed to eliminate the bezel on a front surface of the display device and display an image on the entire front surface of the display device.

The above information disclosed in this Background section is only for enhancement of understanding of the background of the present disclosure, and therefore it may contain information that does not form a prior art that is already known to a person of ordinary skill in the art.

SUMMARY

The present disclosure provides a display device for preventing a common voltage drop and minimizing a right/left bezel.

A display device according an exemplary embodiment of the present disclosure includes: a substrate including a display area and a non-display area; an external common voltage line disposed in the non-display area; a plurality of pixels and a common voltage line disposed in the display area; and a driving voltage line connected to each of the plurality of pixels, wherein a subset of the plurality of pixels overlaps the common voltage line in the display area in a plan view, and the external common voltage line and the common voltage line are connected to each other.

The driving voltage line may be indirectly connected to the subset of the plurality of pixels via a driving voltage connection line.

The external common voltage line may be disposed to surround four edges of the display area.

The common voltage line may further include a transverse common voltage line and a longitudinal common voltage line.

The external common voltage line may be divided via the display area.

The display deice may further include an external initialization voltage line and an external driving voltage line disposed in the non-display area, and each of the external initialization voltage line, the external driving voltage line, and the external common voltage line may have a multi-layered structure.

Each of the external initialization voltage line, the external driving voltage line, and the external common voltage line may include a plurality of portions that are separated from each other, and each of the portions may be connected to each other through a connecting member.

The connecting member may be disposed on a same layer as a gate line, a data line, or a pixel electrode in the display area.

The connecting member may include a first connecting member disposed on a same layer as the gate line and a second connecting member disposed on the a layer as the pixel electrode, and the first connecting member and the second connecting member may overlap each other in the plan view.

The display area may further include a driving voltage connection line disposed in the display area and crossing the driving voltage line, and a width of the driving voltage connection line may decrease where the common voltage line and the driving voltage connection line overlap.

The driving voltage connection line, the driving voltage line, and the common voltage line may be disposed on different layers from each other, and the driving voltage connection line may be disposed to be closer to the substrate than the driving voltage line and the common voltage line.

A common electrode in contact with the external common voltage line in the non-display area may be further included.

A display device according to another exemplary embodiment of the present disclosure includes: a substrate including a display area and a non-display area; an external common voltage line disposed in the non-display area; a plurality of pixels disposed in the display area; a driving voltage line connected to each of the plurality of pixels; and a plurality of common voltage lines disposed in the display area, wherein the external common voltage line and the plurality of common voltage lines are connected to each other.

The external common voltage line may be disposed to surround four edges of the display area.

The plurality of common voltage lines and the driving voltage line may be disposed on a same layer.

Each of the plurality of common voltage lines may further include a transverse common voltage line and a longitudinal common voltage line.

The plurality of common voltage lines may be disposed farther from the substrate than the driving voltage line, and an insulating layer may be disposed between the plurality of common voltage lines and the driving voltage line.

The external common voltage line may be disposed to be divided via the display area.

The display device may further include an external initialization voltage line and an external driving voltage line disposed in the non-display area may be further included, and the external initialization voltage line, each of the external driving voltage line, and the external common voltage line may have a multi-layered structure.

Each of the external initialization voltage line, the external driving voltage line, and the external common voltage line may include a plurality of portions that are separated from each other, and each of the plurality of portions may be connected to each other through a connecting member.

The connecting member may be disposed on a same layer as a gate line, a data line, or a pixel electrode in the display area.

The display device may further include a driving voltage connection line disposed in the display area and crossing the driving voltage line, and a width of the driving voltage connection line may decrease where the common voltage line and the driving voltage connection line overlap.

According to an exemplary embodiment, by connecting the external common voltage line in the non-display area to the common voltage line in the display area, a drop of the common voltage may be prevented, and a right and left bezel of the display device may be minimized.

DETAILED DESCRIPTION OF THE EMBODIMENTS

Figure 1:
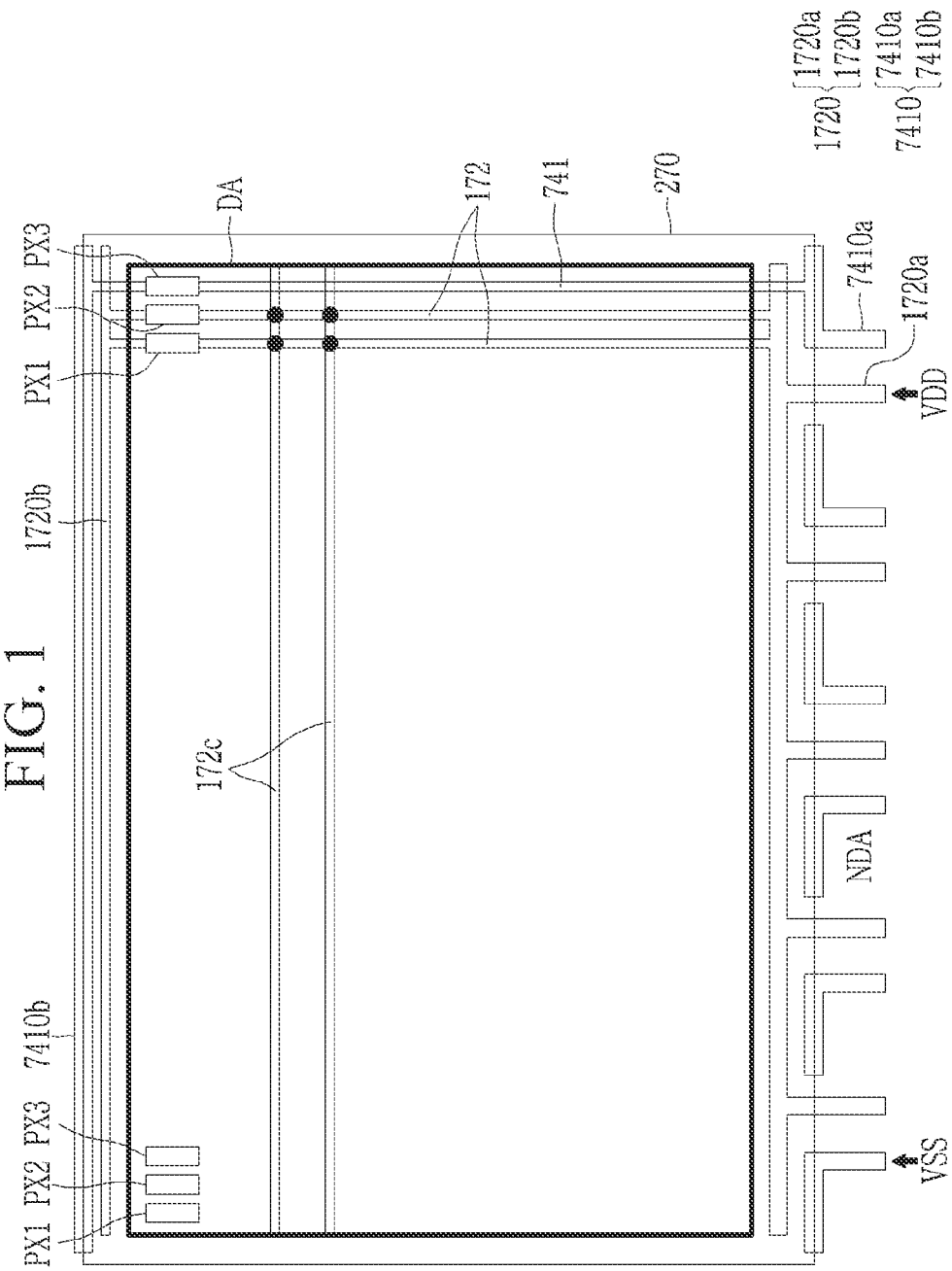
FIG. 1 is a view showing a display device according to an exemplary embodiment of the present disclosure.

The present disclosure will be described more fully hereinafter with reference to the accompanying drawings, in which exemplary embodiments of the present disclosure are shown. As those skilled in the art would realize, the described embodiments may be modified in various different ways, without departing from the spirit or scope of the present disclosure.

The drawings and the accompanying description are to be regarded as illustrative in nature and not restrictive. Like reference numerals designate like elements throughout the specification.

Further, in the drawings, a size and thickness of each element are arbitrarily represented for better understanding and ease of description, and the present disclosure is not limited thereto. In the drawings, the thickness of layers, films, panels, regions, areas, etc., are exaggerated for clarity, better understanding, and ease of description.

It will be understood that when an element such as a layer, film, region, or substrate is referred to as being "on" another element, it can be directly on the other element or one or more intervening elements may also be present therebetween. In contrast, when an element is referred to as being "directly on" another element, there are no intervening elements present. Further, in the specification, the word "on" or "above" means positioned on or below an object portion, and does not necessarily mean positioned on an upper side of the object portion based on a gravitational direction.

In addition, unless explicitly described to the contrary, the word "comprise" and variations such as "comprises" or "comprising" will be understood to imply an inclusion of stated elements but not an exclusion of any other elements.

Further, throughout the specification, the phrase "on a plane" means viewing a target portion from the top, and the phrase "on a cross-section" means viewing a cross-section formed by vertically cutting a target portion from the side.

Now, a display device according to an exemplary embodiment of the present disclosure is described with reference to accompanying drawings.

FIG. 1 is a view showing a display device according to an exemplary embodiment of the present disclosure. Referring to FIG. 1, a display device includes a display area DA and a non-display area NDA.

A plurality of pixels PX1, PX2, and PX3 are disposed in the display area, and a driving voltage line 172 is connected to each pixel and applies a driving voltage VDD to the pixel. A driving voltage connection line 172c crossing the driving voltage line 172 is disposed in the display area DA. The driving voltage connection line 172c crosses the driving voltage line 172 and is connected to the driving voltage line 172 at a crossing point. Thus, the driving voltage transmitted to the driving voltage line 172 may be transmitted to the neighboring pixels via the driving voltage connection line 172c. The driving voltage connection line 172c may be disposed on a different layer from that of the driving voltage line 172.

FIG. 1 shows only a partial view of the pixels PX1, PX2, and PX3, the driving voltage line 172, and the driving voltage connection line 172c for convenience.

An external driving voltage line 1720 is disposed in the non-display area NDA. The external driving voltage line 1720 may include a first driving voltage line 1720a and a second driving voltage line 1720b that are separated from each other via the display area DA. The first driving voltage line 1720a and the second driving voltage line 1720b may not be connected to each other in the non-display area NDA, and may be connected to the driving voltage line 172 in the display area DA.

An external common voltage line 7410 is disposed in the non-display area NDA. The external common voltage line

7410 may include a first common voltage line 7410a and a second common voltage line 7410b that are separated from each other. The first common voltage line 7410a and the second common voltage line 7410b may be separated from each other via the display area DA, and may be connected to each other through a common voltage line 741 that is disposed in the display area DA.

Referring to FIG. 1, one of the driving voltage lines 172 that are connected to a plurality of pixels PX1, PX2, and PX3 may be replaced by the common voltage line 741. Therefore, the first common voltage line 7410a and the second common voltage line 7410b that are spaced apart from each other via the display area DA may be connected to each other via the common voltage lie 741.

Thus, when connecting the first common voltage line 7410a and the second common voltage line 7410b by the common voltage line 741 in the display area DA, an issue of a voltage drop during a transmission period of a common voltage VSS may be resolved. In addition, since the first common voltage line 7410a and the second common voltage line 7410b are not disposed an edge of the display area DA, the left and right non-display areas NDA may be minimized.

In other words, when the external common voltage line 7410 is disposed to surround all four edges of the display area DA, the voltage drop may occur in a process of transmitting the common voltage VSS. In addition, the left and right non-display areas NDA may not be removable because the external common voltage line 7410 should be disposed on the left and right non-display areas NDA outside the left and right edges of the display area DA.

However, as shown in FIG. 1, when the external common voltage lines 7410 are disposed to be separated from each other via the display area DA and are connected to each other through the common voltage line 741 that is disposed in the display area DA, the issue of common voltage reduction may be prevented, and the left and right non-display areas NDA may be removed, thereby minimizing the bezel or even entirely removing the bezel at least on the right and left sides of the display device.

A common electrode 270 (herein also referred to as a second electrode) is in contact with the external common voltage line 7410, thereby receiving the common voltage VSS. As shown in FIG. 1, the driving voltage line 172 that is connected to the pixel PX3 among those connected to the plurality of pixels PX1, PX2, and PX3 is replaced with the common voltage line 741, however the driving voltage line 172 is connected by the driving voltage connection line 172c in the display area DA, thereby all pixels PX1, PX2, and PX3 may receive the driving voltage VDD.

Table 1 below shows a long range uniformity (LRU), a voltage drop, and a panel consumption power reduction amount of the display device according to an exemplary embodiment of FIG. 1. Table 2 shows an LRU, a voltage drop, and a panel consumption power reduction amount of a comparative display device in which the common voltage line 741 is not disposed in the display area DA and the external common voltage line 7410 surrounds all four edges of the display area DA.

TABLE 1

| Items | Result |
| --- | --- |
| LRU (%) | 81.25 |
| VDD Drop (V) | 0.22 |
| VSS Drop (V) | 2.16 |
| Panel consumption power reduction amount | 19.2% |

TABLE 2

| Items | Result |
| --- | --- |
| LRU (%) | 79.24 |
| VDD Drop (V) | 0.18 |
| VSS Drop (V) | 4.09 |

Comparing Table 1 and Table 2, when the external common voltage line 7410 is not disposed on the right and left sides of the display area DA, and the external common voltage lines 7410 are connected by the common voltage line 741 inside the display area DA, the amount of common voltage reduction is low. By connecting the external common voltage lines 7410 by the common voltage line 741 in the display area DA, the common voltage drop may be reduced, and the LRU may be improved.

Figure 2:
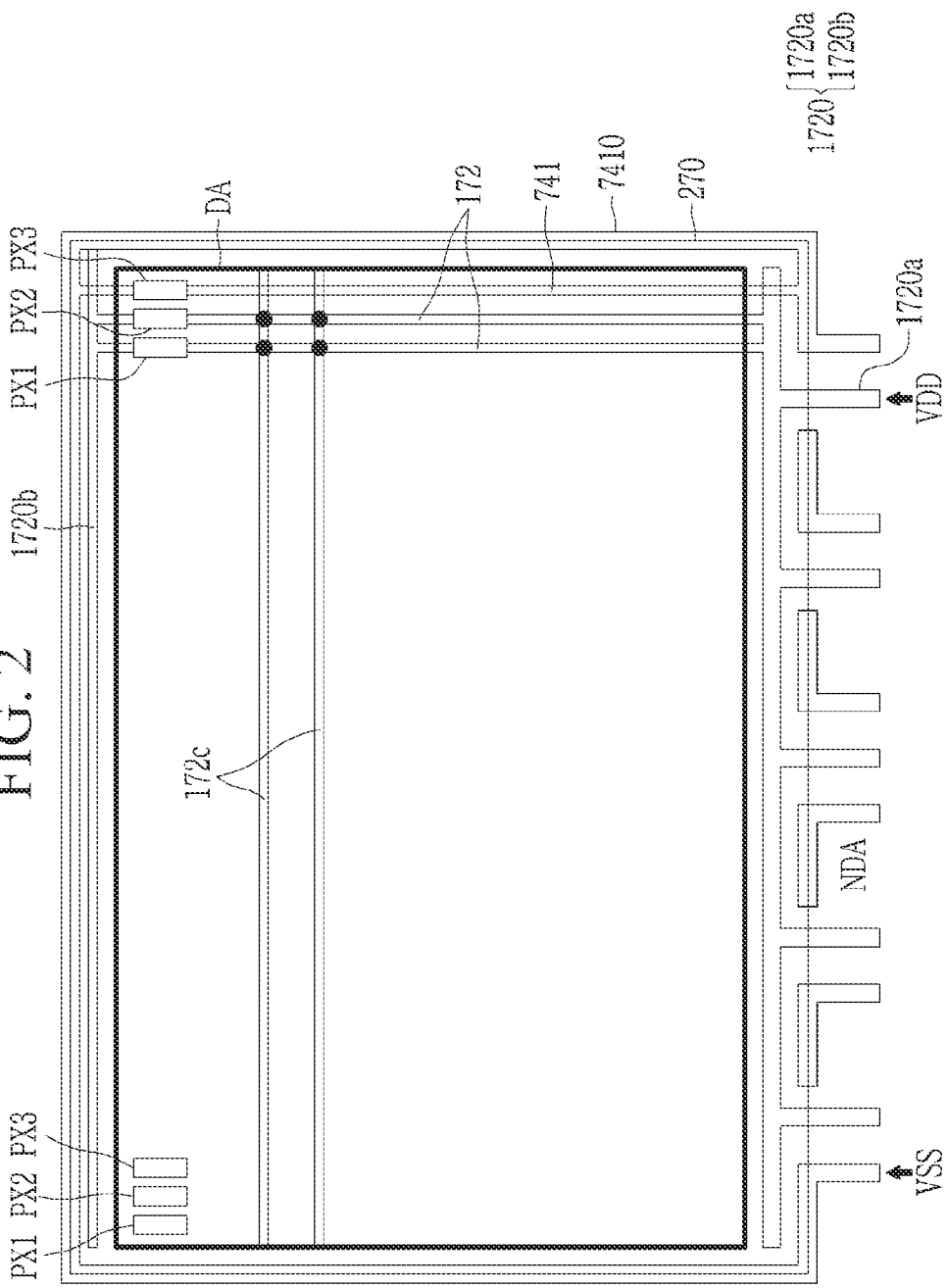
FIG. 2 is a view showing a display device according to another exemplary embodiment.

FIG. 2 is a view showing a display device according to another exemplary embodiment. Referring to FIG. 2, the display device is the same as that of FIG. 1 except for the shape of the external common voltage line 7410 and the point that the external common voltage line 7410 surrounds the four edges of the display area DA. The detailed description of the same constituent elements is omitted. In the case of FIG. 2, like in FIG. 1, the common voltage line 741 that is disposed in the display area DA is connected to the external common voltage lines 7410. Therefore, it is possible to prevent the voltage drop during the transmission process of the common voltage VSS.

Figure 3:
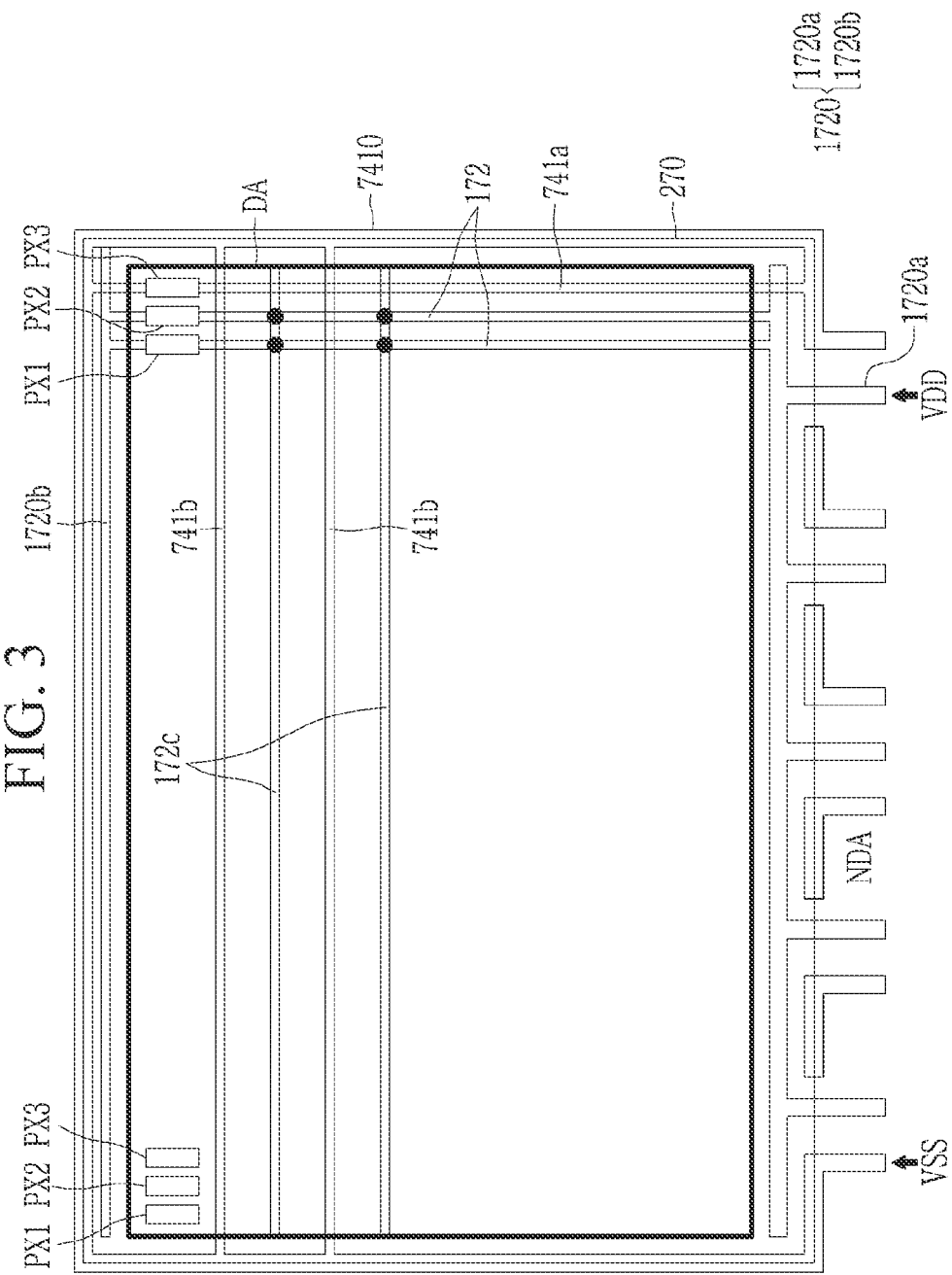
FIG. 3 is a view showing a display device according to another exemplary embodiment.

FIG. 3 is a view showing a display device according to another exemplary embodiment. Referring to FIG. 3, the display device is the same as that of FIG. 2, except that the common voltage line 741 disposed in the display area DA includes a transverse common voltage line 741b and a longitudinal common voltage line 741a. The detailed description of the same constituent elements is omitted. That is, the display device has a mesh structure of which the common voltage line 741 includes the transverse common voltage line 741b and the longitudinal common voltage line 741a. In this case, the reduction of the common voltage VSS may be effectively prevented, and the common voltage VSS may be uniformly transmitted through the common voltage line 741 having the mesh structure.

Figure 4:
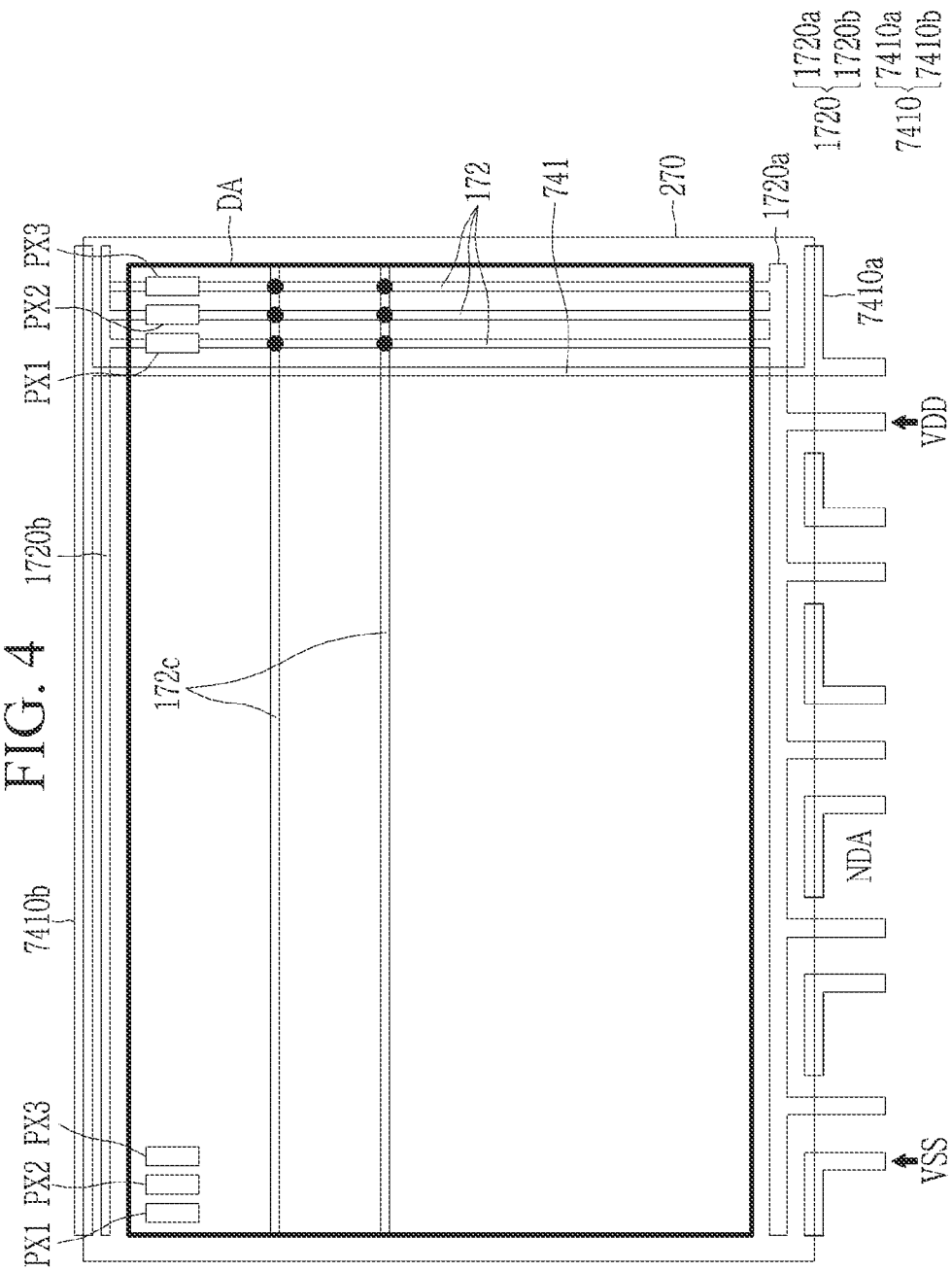
FIG. 4 is a view showing a display device according to another exemplary embodiment.
Figure 5:
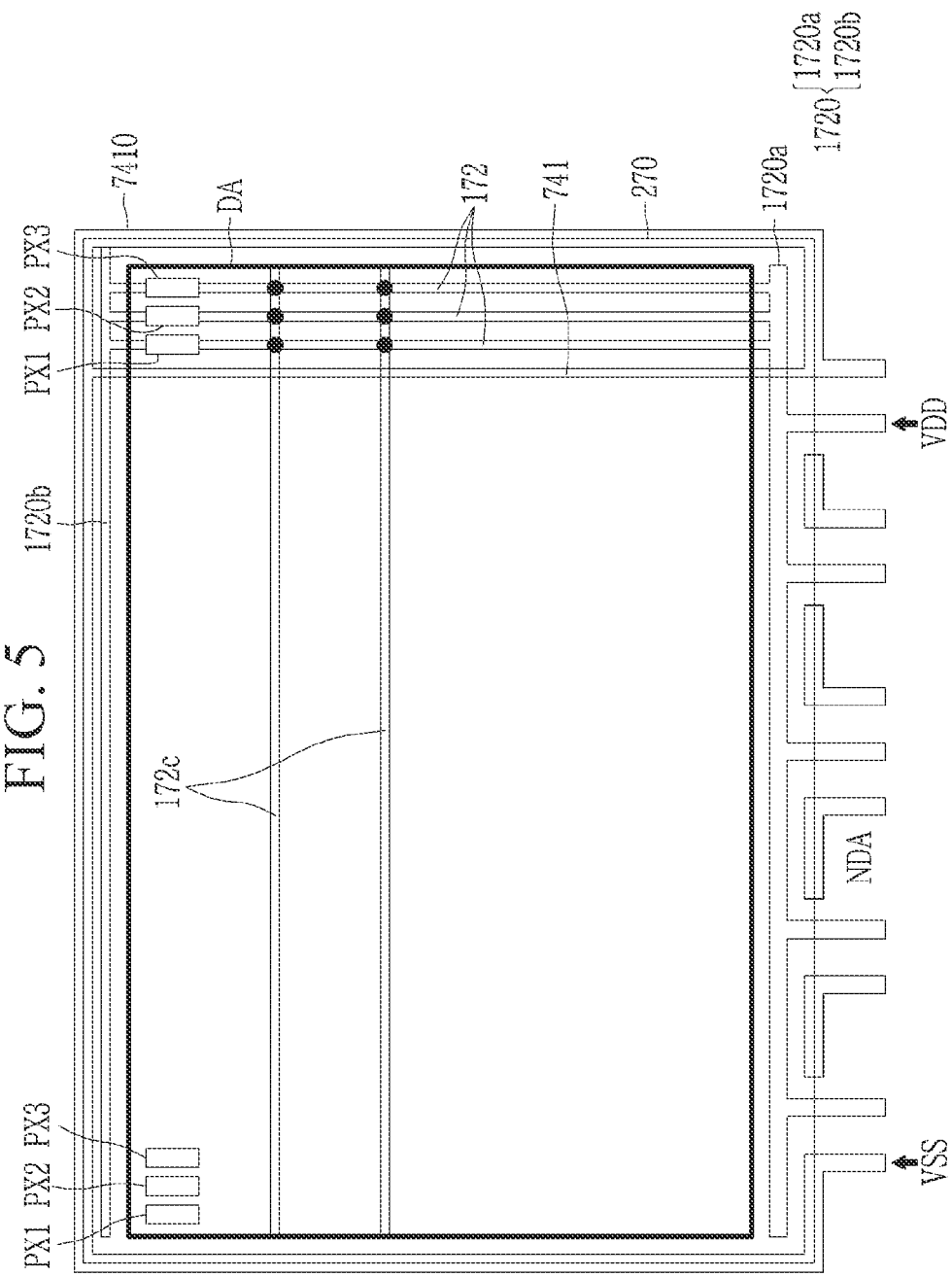
FIG. 5 is a view showing a display device according to another exemplary embodiment.
Figure 6:
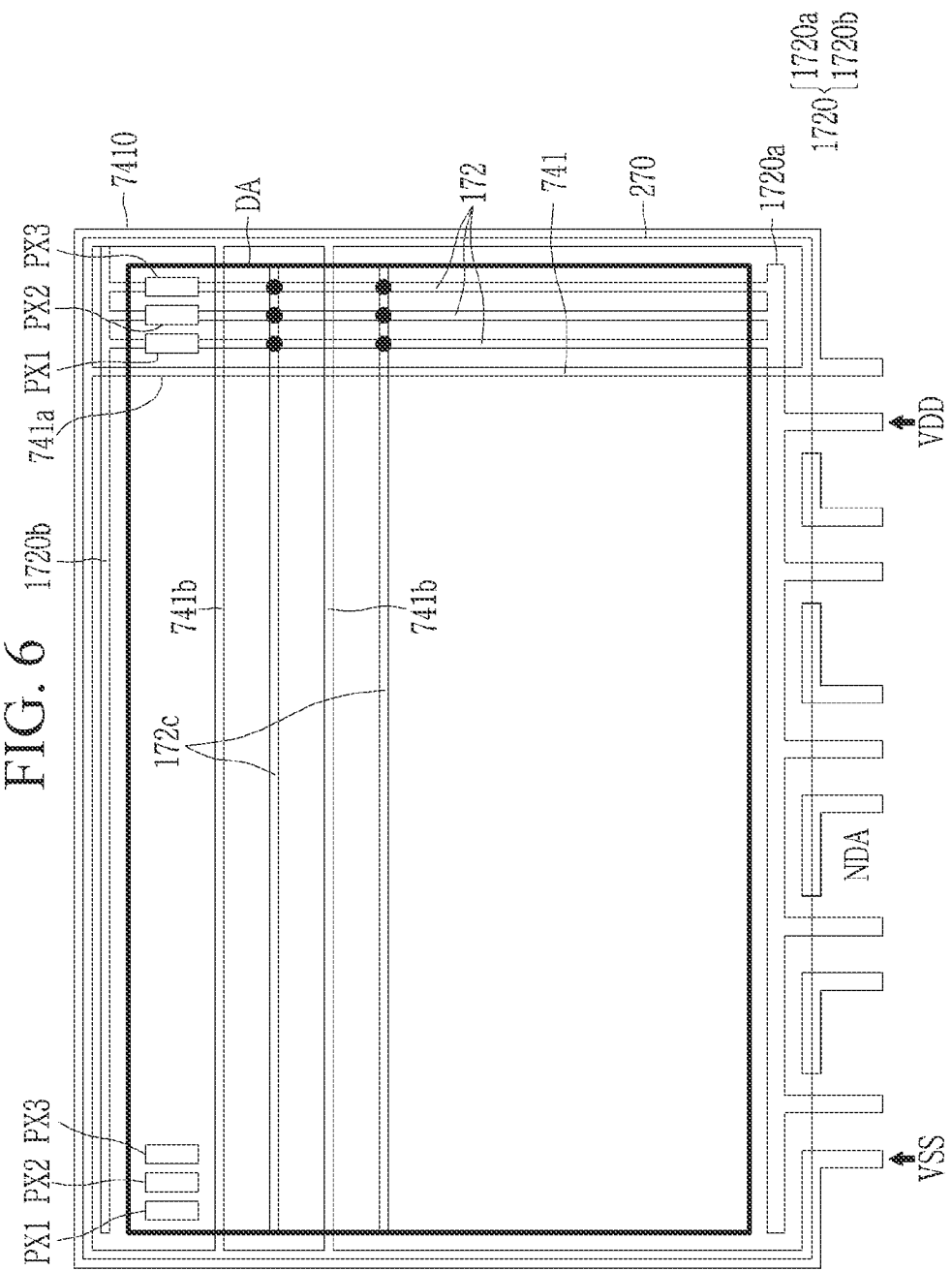
FIG. 6 is a view showing a display device according to another exemplary embodiment.

FIGS. 4 to 6 are views showing a display device according to another exemplary embodiment, respectively. Referring to FIG. 4, the common voltage line 741 is disposed in the display area DA, however, unlike the display device shown in FIG. 1, the common voltage line 741 is disposed separately from the driving voltage line 172 that is respectively connected to the pixels PX1, PX2, and PX3. Other configurations are the same as those shown in FIG. 1, and detailed description of the same configurations is omitted. That is, if there is a sufficient space where the common voltage line 741 may be separately disposed in the display area DA, the common voltage line 741 may be separately formed without removing the existing driving voltage line 172.

FIG. 5 is also the same FIG. 2, except for additionally forming the common voltage line 741 without removing the driving voltage line 172 in the display area DA. The detailed description of the same constituent elements is omitted.

FIG. 6 is the same as FIG. 3, except for additionally forming the common voltage line 741 without removing the driving voltage line 172 in the display area DA. The detailed description of the same constituent elements is omitted.

In FIG. 1 to FIG. 6, the driving voltage connection line 172c, the driving voltage line 172, and the common voltage line 741 may be respectively disposed in different layers, thereby being separated from each other. Although the driving voltage connection line 172c and the driving voltage line 172 may be disposed in the different layers from each other, they are connected through a contact hole, thereby uniformly transmitting the driving voltage VDD.

Figure 7:
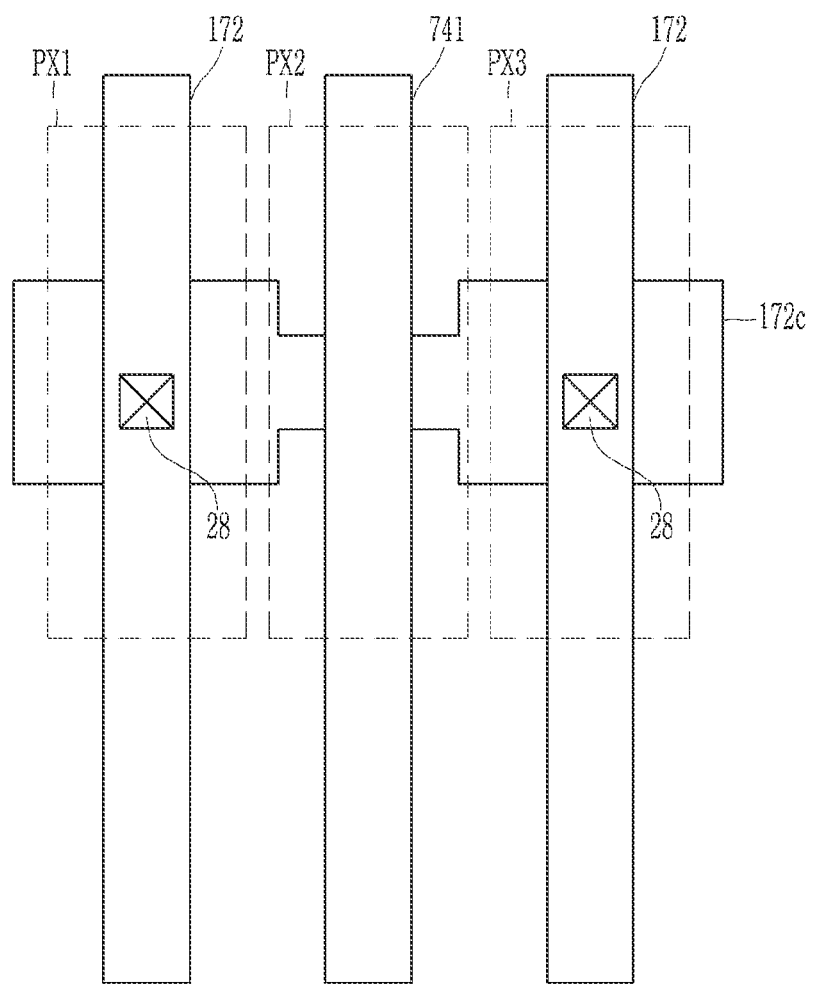
FIG. 7 is a view schematically showing an arrangement shape of a driving voltage connection line, a driving voltage line, and a common voltage line in a display area of a display device according to an exemplary embodiment.

FIG. 7 schematically shows an arrangement shape of the driving voltage connection line 172c, the driving voltage line 172, and the common voltage line 741 in the display area DA. In FIG. 7, PX1, PX2, and PX3 represents the pixels that are connected to respective ones of one or more connecting wires.

Referring to FIG. 7, the driving voltage connection line 172c, the driving voltage line 172, and the common voltage line 741 are disposed on the different layers, respectively. For example, the driving voltage connection line 172c may be disposed on a bottommost layer such that it is closest to a substrate of the display device, followed by the driving voltage line 172 and the common voltage line 741. However, the present disclosure is not limited thereto, and they may be disposed in different stacking orders. In some embodiments, the driving voltage line 172 and the common voltage line 741 may be disposed on the same layer.

Referring to FIG. 7, a width of the driving voltage connection line 172c overlapping the common voltage line 741 may be narrower than a width of the driving voltage connection line 172c overlapping the driving voltage line 172. Therefore, a shorting risk of the common voltage line 741 and the driving voltage connection line 172c to each other may be reduced. The driving voltage connection line 172c and the driving voltage line 172 are connected to each other through a contact hole 28.

Figure 8:
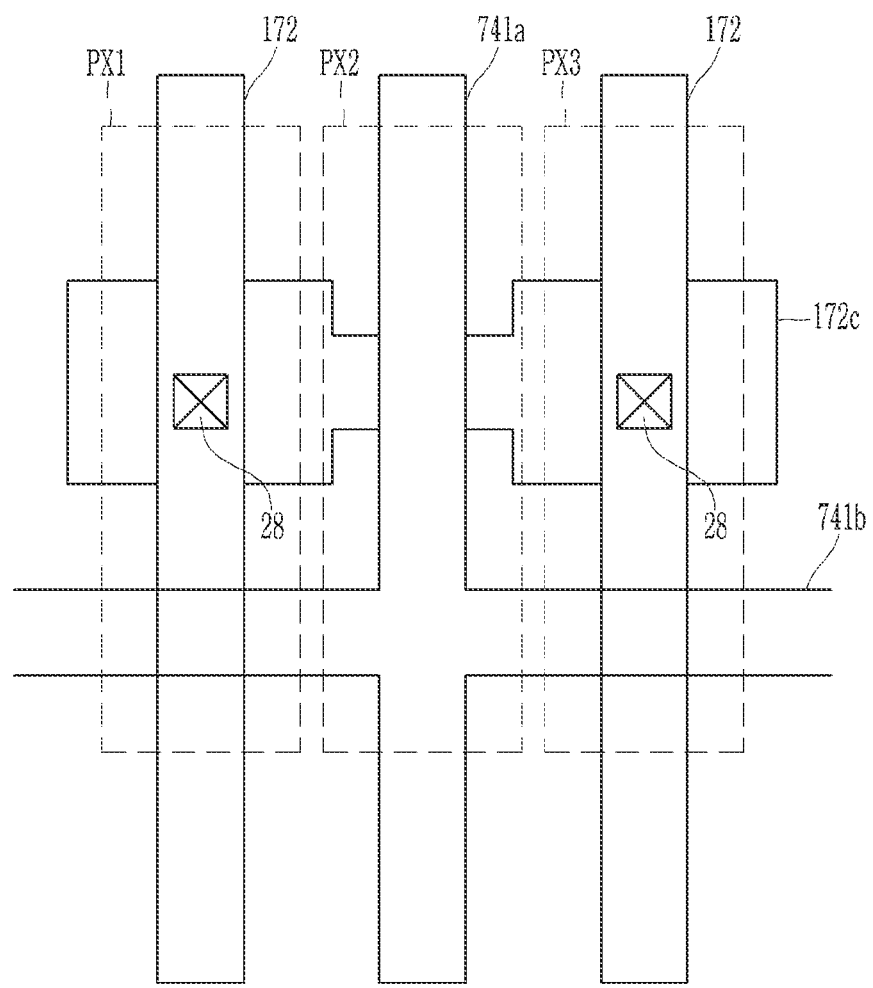
FIGS. 8 to 10 are views schematically showing an arrangement shape of a driving voltage connection line, a driving voltage line, and a common voltage line within a display area in a display device according to another exemplary embodiment, respectively.

FIG. 8 schematically shows an arrangement shape of the driving voltage connection line 172c, the driving voltage line 172, and the common voltage line 741 in the display area DA in the display device according to another exemplary embodiment. Referring to FIG. 8, the common voltage line 741 includes the transverse common voltage line 741b and the longitudinal common voltage line 741a. The display device is the same as the display device according to the exemplary embodiment of FIG. 7, except that the common voltage line 741 includes the transverse common voltage line 741b and the longitudinal common voltage line 741a. The detailed description of the same constituent elements is omitted.

The transverse common voltage line 741b and the longitudinal common voltage line 741a may be disposed on the same layer and be connected to each other. That is, the common voltage line 741 may have a mesh shape including the transverse common voltage line 741b and the longitudinal common voltage line 741a. In this case, the common voltage line 741 may be disposed on a layer that is different from a layer of the driving voltage line 172, and an insulating layer may be disposed therebetween. In one embodiment, the driving voltage line 172 may be disposed closer to the substrate than the common voltage line 741.

Figure 9:
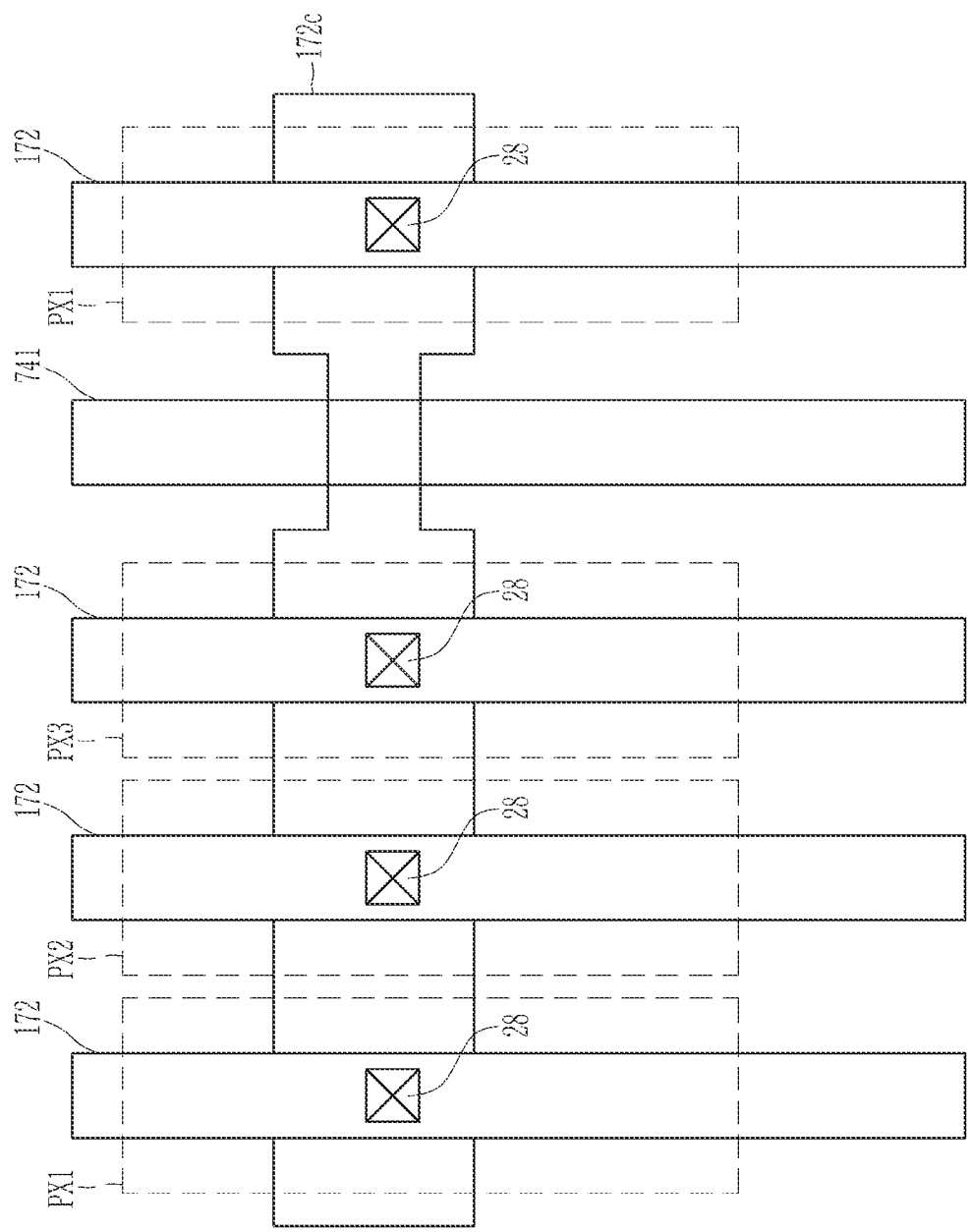

FIG. 9 schematically shows an arrangement shape of the driving voltage connection line 172c, the driving voltage line 172, and the common voltage line 741 in the display area DA in the display device according to another exemplary embodiment. Referring to FIG. 9, the display device is the same as the exemplary embodiment of FIG. 7, except that the common voltage line 741 is disposed outside the pixels PX1, PX2, and PX3. The detailed description of the same constituent elements is omitted. Because the common driving voltage line 741 is disposed outside the pixels PX1, PX2, and PX3, the common voltage line 741 is disposed without removing the existing driving voltage line 172. That is, each driving voltage line 172 is connected to the respective ones of the pixels PX1, PX2, and PX3, and the common voltage line 741 is disposed separately in each an empty region between the pixels. The common voltage line 741 may be disposed on the same layer as the driving voltage line 172.

Figure 10:
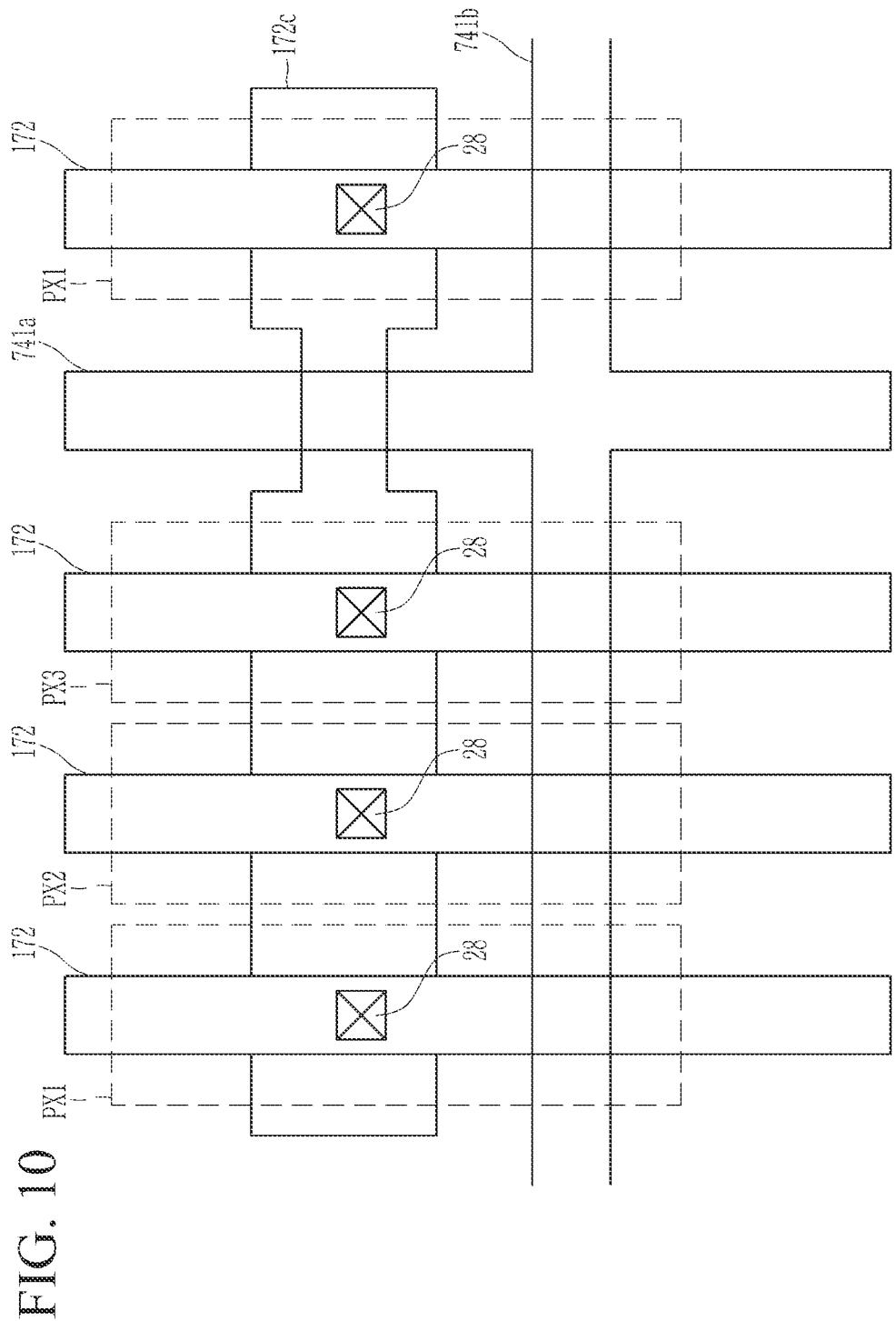

FIG. 10 schematically shows an arrangement shape of the driving voltage connection line 172c, the driving voltage line 172, and the common voltage line 741 in the display area DA in the display device according to another exemplary embodiment. Referring to FIG. 10, the common voltage line 741 includes the transverse common voltage line 741b and the longitudinal common voltage line 741a. The display device is the same as the display device according to the exemplary embodiment of FIG. 9, except that the common voltage line 741 includes the transverse common voltage line 741b and the longitudinal common voltage line 741a. The detailed description of the same constituent elements is omitted.

The transverse common voltage line 741b and the longitudinal common voltage line 741a may be disposed on the same layer and be connected to each other. That is, the common voltage line 741 may have a mesh shape including the transverse common voltage line 741ba and the longitudinal common voltage line 741a.

The common voltage line 741 may be disposed on the driving voltage line 172. The common voltage line 741 may be disposed farther away from the substrate than the driving voltage line 172, and an insulating layer may be disposed between the driving voltage line 172 and the common voltage line 741.

Next, various methods of connecting wires of the display area DA and the non-display area NDA are described with reference to accompanying drawings.

Figure 11:
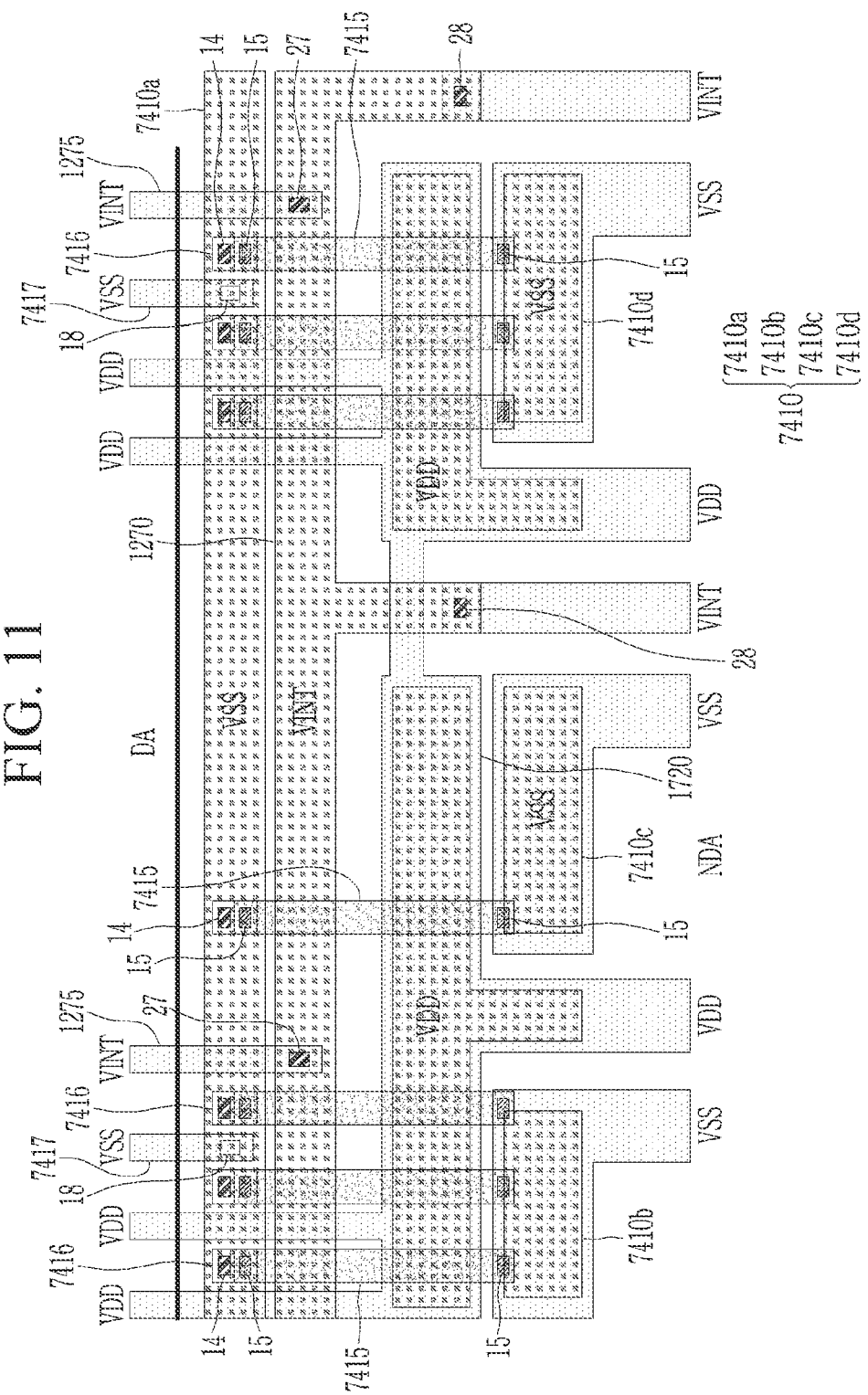
FIG. 11 is a view showing a wiring connection structure of a display area and a non-display area in a display device according to an exemplary embodiment of the present disclosure.
Figure 12:
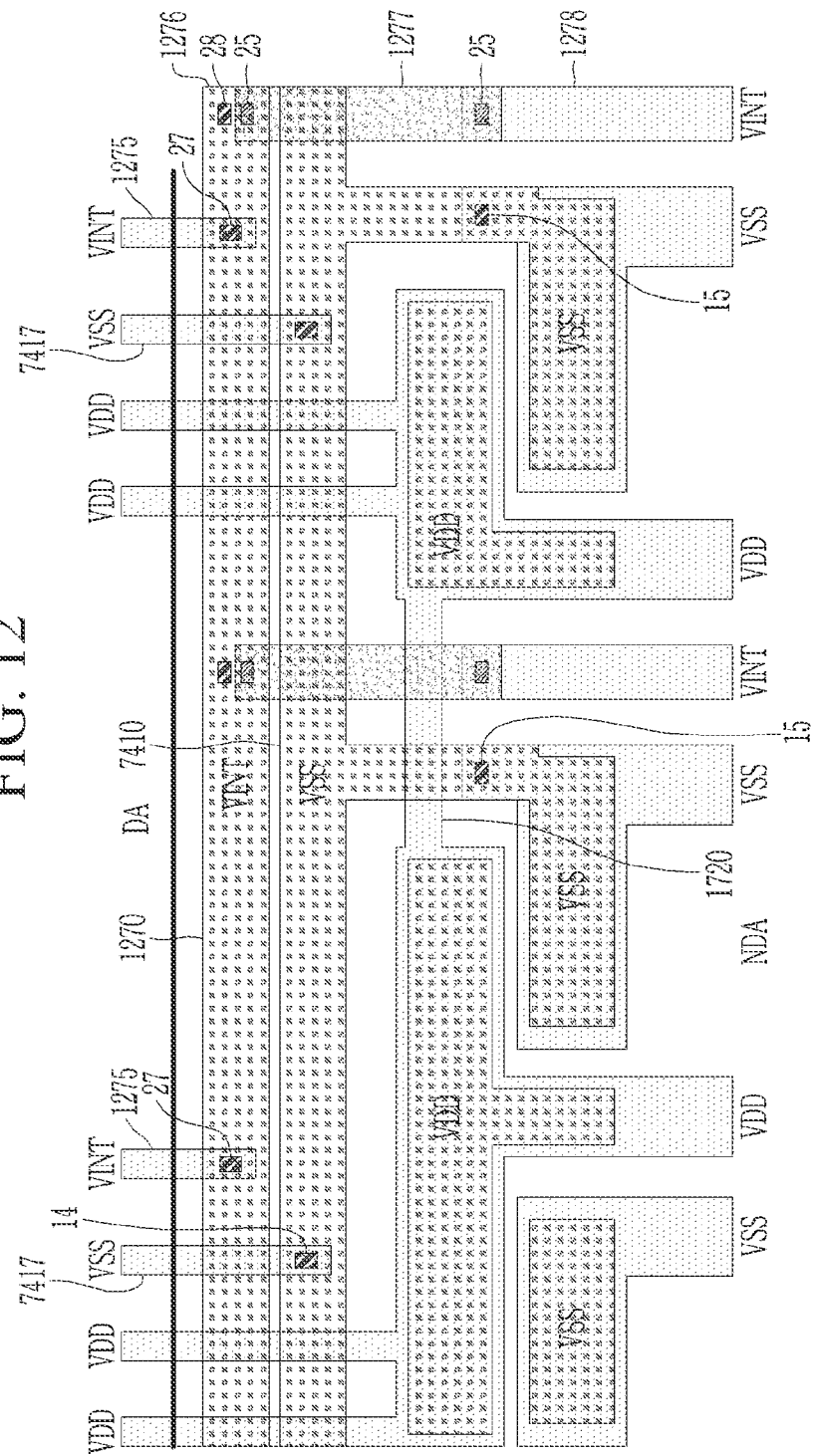
FIG. 12 and FIG. 13 are views showing a wiring connection structure of a display area and a non-display area in a display device according to another exemplary embodiment.
Figure 13:
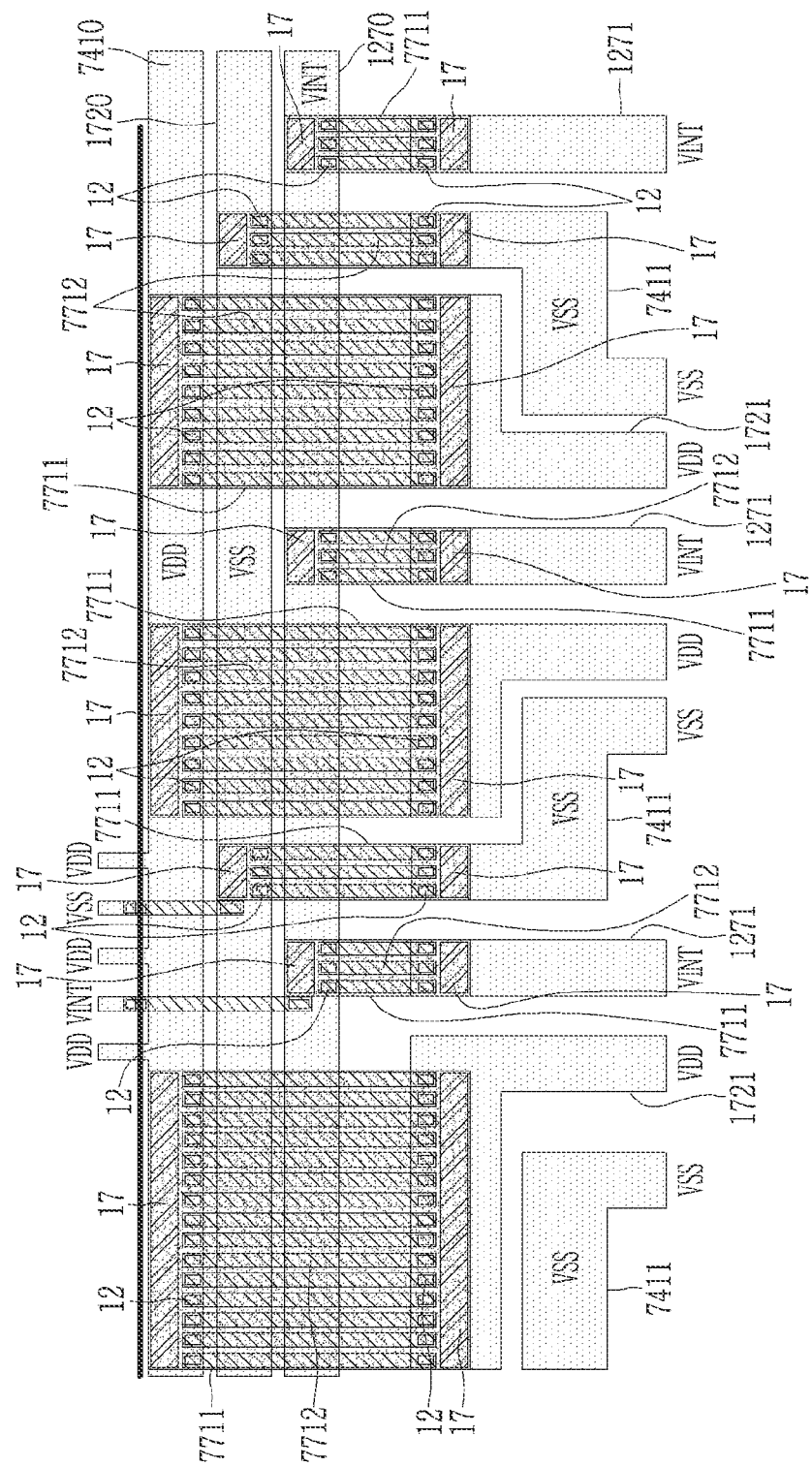

FIG. 11 shows a wiring connection structure of the display area DA and the non-display area NDA in the display device according to an exemplary embodiment of the present disclosure. In FIG. 11 to FIG. 13, for better comprehension and ease of description, the voltage transmitted from each wire is described on the wiring.

Referring to FIG. 11, the display device includes the external common voltage line 7410, an external initialization voltage line 1270, and the external driving voltage line 1720 that are disposed in the non-display area NDA.

The external common voltage line 7410 includes the first common voltage line 7410a, the second common voltage line 7410b, a third common voltage line 7410c, and a fourth common voltage line 7410d that are separated from each other. The external common voltage line 7410 may be formed in a plurality of layers including at least a first layer and a second layer. In FIG. 11, the first layer and the second layer are shown in different patterns. The second to fourth common voltage lines 7410b, 7410c, and 7410d may include the first layer and the second layer, and the first common voltage line 7410a may include only the first layer.

In this case, the first layer may be the same layer as a first source/drain layer of the display area DA, and the second layer may be the same layer as a second source/drain layer of the display area DA.

The first to fourth common voltage lines 7410a, 7410b, 7410c, and 7410d are connected to each other through a first connecting member 7415, a second connecting member 7146, and contact holes 14 and 15. The first connecting member 7415 may be disposed in the same layer in which a pixel electrode in the display area DA is disposed. The first connecting member 7415 may be connected to the second connecting member 7416 through the contact hole 15, and the second connecting member 7416 may be connected to the external common voltage line 7410a through the contact hole 14. The second connecting member 7416 may be disposed in the same layer as the second source/drain layer of the display area DA.

In addition, the first common voltage line 7410a that is disposed close to the display area DA is connected to the common voltage line 741 that is disposed in the display area DA through a connecting member 7417. The first common voltage line 7410a and the connecting member 7417 may be connected through a contact hole 18. The connecting member 7417 may be disposed in the same layer as the second source/drain layer.

The external initialization voltage line 1270 is partially protruded, and a portion of the protruded region includes the second layer. That is, the external initialization voltage line 1270 may include the first layer that is at the same layer as the first source/drain layer of the display area DA and the second layer that is at the same layer as the second source/drain layer of the display area DA.

The external initialization voltage line 1270 is connected to an initialization voltage line 127 inside the display area DA through a connecting member 1275. The connecting member 1275 may be disposed in the same layer as the second source/drain layer. The connecting member 1275 may be connected to the external initialization voltage line 1270 via a contact hole 27. The second layer of the connecting member 1275 may also be connected to the first layer through the contact hole 28.

The external driving voltage line 1720 may include the first layer that is the same layer as the first source/drain layer of the display area DA and the second layer that is the same layer as the second source/drain layer of the display area DA. A portion of the second layer extends to the display area DA to be connected to the driving voltage line 172 of the display area DA.

Next, the display device according to another exemplary embodiment of the present disclosure is described with reference to FIG. 12. Referring to FIG. 12, the external initialization voltage line 1270 is disposed closer to the display area DA than the external common voltage line 7410. The external initialization voltage line 1270 is connected to the connecting member 1275 by the contact hole 27, and is connected to the initialization voltage line 127 inside the display area DA through the connecting member 1275. The connecting member 1275 may be disposed in the same layer as the first source/drain layer of the display area DA. The external initialization voltage line 1270 may be connected to the outside via connecting members 1276, 1277, and 1278. The connecting member 1276 and the connecting member 1278 may be disposed in the same layer as the connecting member 1275, and the connecting member 1277 may be disposed in the same layer as the pixel electrode in the display area DA. The connecting member 1277 may be respectively connected to the connecting member 1276 and the connecting member 1278 through a contact hole 25. The connecting member 1276 is also connected to the external initialization voltage line 1270 via the contact hole 28.

The external common voltage line 7410 is connected to the connecting member 7417 via the contact hole 14. The external common voltage line 7410 is connected to the common voltage line 741 of the display area DA via the connecting member 7417. The external common voltage line 7410 is disposed in the same layer as the first source/drain layer of the display area DA. A portion of the external common voltage line 7410 includes the second layer, and the second layer is disposed in the same layer as the second source/drain layer of the display area DA. The first layer and the second layer may be connected to each other through the contact hole 15.

Next, the external driving voltage line 1720 is described. The external driving voltage line 1720 includes the first layer that is the same as the first source/drain layer of the display area DA and the second layer that is the same as the second source/drain layer of the display area DA. The portions of the first layer of the external driving voltage line 1720 are separated from each other, but are connected to each other by the second layer. A portion of the second layer extends to be connected to the driving voltage line 172 of the display area DA to transmit the driving voltage VDD.

Next, the display device according to another exemplary embodiment of the present disclosure is described with reference to FIG. 13. Referring to FIG. 13, the external driving voltage line 1720, the external common voltage line 7410, and the external initialization voltage line 1270 are formed in a single layer. Each of the external driving voltage line 1720, the external common voltage line 7410, and the external initialization voltage line 1270 is disposed in a direction parallel to an edge of the display area DA.

In addition, an external driving voltage line 1721, an external common voltage line 7411, and an external initialization voltage line 1271 of an island shape are respectively connected to the external driving voltage line 1720, the external common voltage line 7410, and the external initialization voltage line 1270 of an island shape through a connecting member 7711. The connecting member 7711 is connected to each wire through a contact hole 17. The connecting member 7711 may be disposed in the same layer in which the pixel electrode in the display area DA is disposed.

In addition, the external driving voltage line 1721, the external common voltage line 7411, and the external initialization voltage line 1271 of the island shape are respectively connected to the external driving voltage line 1720, the external common voltage line 7410, and the external initialization voltage line 1270 of the island shape through a connecting member 7712. Each of the connecting member 7712 is connected to the wiring through a contact hole 12. The connecting member 7712 may be disposed at the same layer as a gate conductor layer in the display area DA.

The island shape wiring and the linear shape wiring may be connected through two connecting members overlapping each other. That is, the wires that are separated from each other are connected through the connecting member 7712 that is disposed at the same layer as the gate conductor layer in the display area DA and the connecting member 7711 that is disposed at the same layer in which the pixel electrode in the display area DA is disposed.

FIG. 11 to FIG. 13 are merely examples, and the wiring connection structure of the display device illustrated in FIG. 1 to FIG. 9 is not limited to the structure of FIG. 11 to FIG. 13.

Figure 14:
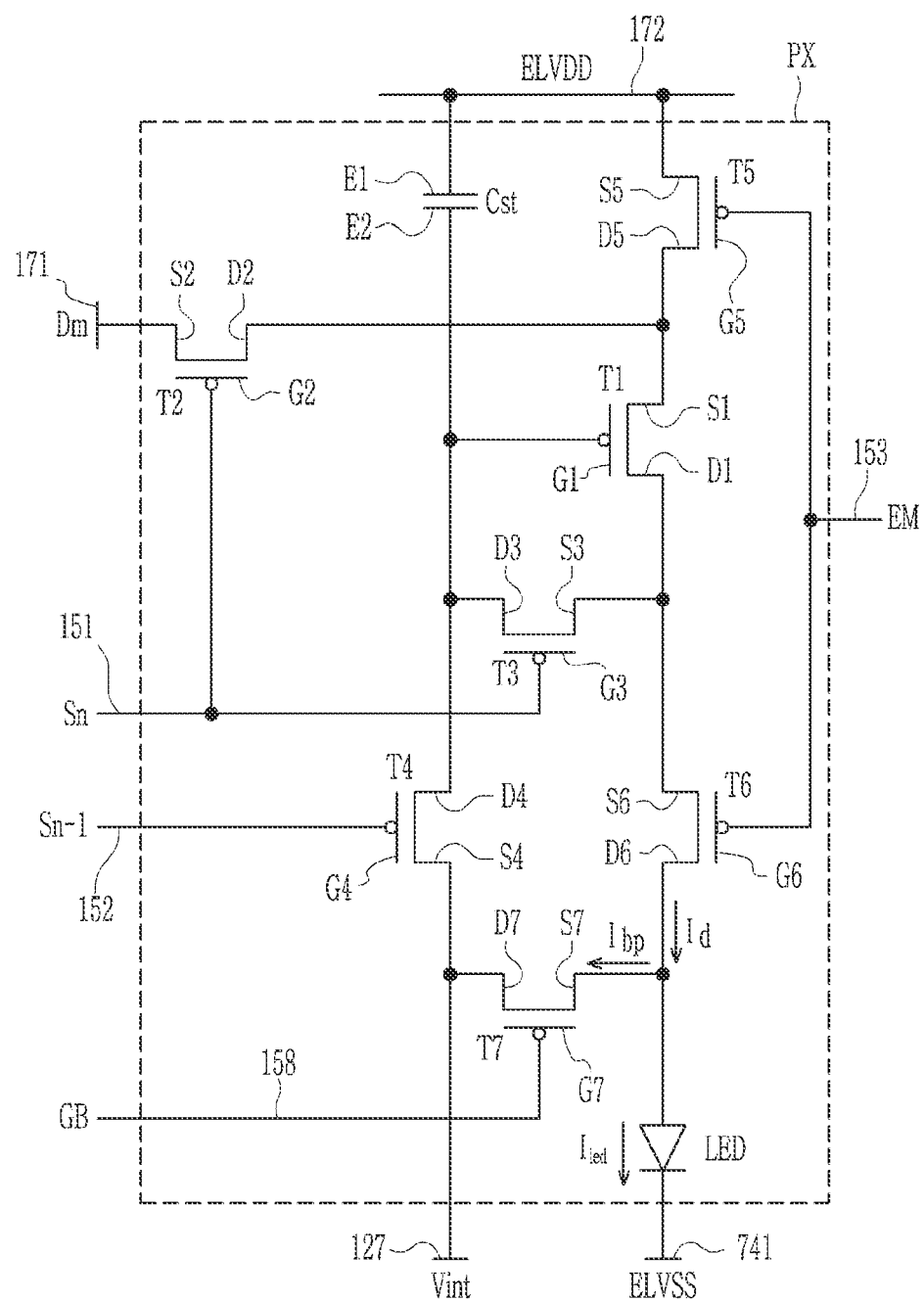
FIG. 14 is a view of an equivalent circuit diagram of one pixel of a display device according to an exemplary embodiment.

Next, a pixel structure of the display area DA is described with reference to FIG. 14 to FIG. 16. FIG. 14 is an equivalent circuit diagram of one pixel of a display device according to an exemplary embodiment.

Referring to FIG. 14, a pixel PX of the display device includes a plurality of transistors T1, T2, T3, T4, T5, T6, and T7, a storage capacitor Cst, a light emitting diode LED, and a plurality of signal lines 127, 151, 152, 153, 158, 171, 172, and 741.

The display device includes a display area in which an image is displayed, and the pixel PX is arranged in various forms in the display area.

The plurality of transistors T1, T2, T3, T4, T5, T6, and T7 include a driving transistor T1, two switching transistors connected to a scan line 151 including a second transistor T2 and a third transistor T3, and compensation transistors T4, T5, T6, and T7 for operating the light emitting diode LED. These compensation transistors T4, T5, T6, and T7 may include a fourth transistor T4, a fifth transistor T5, a sixth transistor T6, and a seventh transistor T7.

The plurality of signal lines 127, 151, 152, 153, 158, 171, 172, and 741 may include a scan line 151, a previous scan line 152, a light emission control line 153, a bypass control line 158, a data line 171, a driving voltage line 172, an initialization voltage line 127, and a common voltage line 741. The bypass control line 158 may correspond to a portion of the previous scan line 152 or may be electrically connected thereto.

The scan line 151 is connected to a gate electrode G2 of the second transistor T2 and a gate electrode G3 of the third transistor T3 and transmits a scan signal Sn. The previous scan line 152 is connected to a gate electrode G4 of the fourth transistor T4 and transmits a previous scan signal S(n−1) that is applied to the pixel PX disposed at a previous stage. The light emission control line 153 is connected to a light emission controller (not shown) and transmits a light emission control signal EM to a gate electrode G5 of the fifth transistor T5 and a gate electrode G6 of the sixth transistor T6 and controls a time that the light emitting diode LED emits. The bypass control line 158 transfers a bypass signal GB to a gate electrode G7 of the seventh transistor T7.

The data line 171 is a wire that transmits a data voltage Dm that is generated from a data driver (not shown), and a luminance of the light emitting diode LED (also referred to as a light-emitting element) varies depending on the data voltage Dm. The driving voltage line 172 applies a driving voltage ELVDD (also referred to as VDD as shown in FIG. 1). The initialization voltage line 127 transmits an initialization voltage Vint that initializes a voltage applied to a gate electrode G1 of the driving transistor T1 when the fourth transistor T4 is turned on. The common voltage line 741 applies a common voltage ELVSS (also referred to as VSS as shown in FIG. 1). The voltage applied to the driving voltage line 172, the initialization voltage line 127, and the common voltage line 741 may be a constant voltage.

The driving transistor T1 adjusts an amount of a driving current Id that is output from the driving transistor T1 depending on the data voltage Dm. The driving current Id is applied to the light emitting diode LED to control the brightness of the light emitting diode LED depending on the data voltage Dm. For this purpose, a first electrode S1 of the driving transistor T1 is disposed to receive the driving voltage ELVDD. The first electrode S1 is connected to the driving voltage line 172 via the fifth transistor T5. In addition, the first electrode S1 of the driving transistor T1 is also connected to a second electrode D2 of the second transistor T2, so that the data voltage Dm is also applied to the first electrode S1 when the second transistor T2 is turned on. A second electrode D1 (an output electrode) of the driving transistor T1 is disposed to output the driving current Id toward the light emitting diode LED. The second electrode D1 of the driving transistor T1 is connected to the light emitting diode LED via the sixth transistor T6. On the other hand, the gate electrode G1 of the driving transistor T1 is connected to a second storage electrode E2 of the storage capacitor Cst. Therefore, the voltage applied to the gate electrode G1 of the driving transistor T1 changes according to the voltage stored in the storage capacitor Cst, and the driving current Id output from the driving transistor T1 varies accordingly.

The second transistor T2 receives the data voltage Dm into the pixel PX. The gate electrode G2 of the second transistor T2 is connected to the scan line 151, a first electrode S2 of the second transistor T2 is connected to the data line 171, and a second electrode D2 of the second transistor T2 is connected to the first electrode S1 of the driving transistor T1. When the second transistor T2 is turned on according to the scan signal Sn transmitted through the scan line 151, the data voltage Dm transmitted through the data line 171 is transferred to the first electrode S1 of the driving transistor T1.

The third transistor T3 allows a compensation voltage (a sum of data voltage Dm and a threshold voltage Vth of the driving transistor T1), of which the data voltage Dm is changed through the driving transistor T1, to be transmitted to the second storage electrode E2 of the storage capacitor Cst. The gate electrode G3 of the third transistor T3 is connected with the scan line 151, a first electrode S3 of the third transistor T3 is connected to the second electrode D1 of the driving transistor T1, and a second electrode D3 of the third transistor T3 is connected to the second storage electrode E2 of the storage capacitor Cst and the gate electrode G1 of the driving transistor T1. When the third transistor T3 is turned on according to the scan signal Sn transmitted through the scan line 151, the gate electrode G1 and the second electrode D1 of the driving transistor T1 are diode-connected, and the second electrode D1 of the driving transistor T1 and the second storage electrode E2 of the storage capacitor Cst are connected.

The fourth transistor T4 serves to initialize the gate electrode G1 of the driving transistor T1 and the second storage electrode E2 of the storage capacitor Cst. The gate electrode G4 of the fourth transistor T4 is connected to the previous scan line 152, a first electrode S4 of the fourth transistor T4 is connected to the initialization voltage line 127, and a second electrode D4 of the fourth transistor T4 is connected to the second storage electrode E2 of the storage capacitor Cst and the gate electrode G1 of the driving transistor T1 via the second electrode D3 of the third transistor T3. The fourth transistor T4 transfers the initialization voltage Vint to the gate electrode G1 of the driving transistor T1 and the second storage electrode E2 of the storage capacitor Cst according to the previous scan signal S(n−1) transmitted through the previous scan line 152. Thus, the gate voltage of the gate electrode G1 of the driving transistor T1 and the storage capacitor Cst are initialized. The initialization voltage Vint has a low voltage value, thereby being a voltage that may turn on the driving transistor T1.

The fifth transistor T5 serves to transmit the driving voltage ELVDD to the driving transistor T1. The gate electrode G5 of the fifth transistor T5 is connected to the light emission control line 153, a first electrode S5 of the fifth transistor T5 is connected to the driving voltage line 172, and a second electrode D5 of the fifth transistor T5 is connected to the first electrode S1 of the driving transistor T1.

The sixth transistor T6 serves to deliver the driving current Id that is output from the driving transistor T1 to the light emitting diode LED. The gate electrode G6 of the sixth transistor T6 is connected to the light emission control line 153, a first electrode S6 of the sixth transistor T6 is connected to the second electrode D1 of the driving transistor T1, and a second electrode D6 of the sixth transistor T6 is connected to an anode of the light emitting diode LED.

The fifth transistor T5 and the sixth transistor T6 are simultaneously turned on according to the light emission control signal EM transmitted through the light emission control line 153. When the driving voltage ELVDD is applied to the first electrode S1 of the driving transistor T1 through the fifth transistor T5, the driving transistor T1 outputs the driving current Id according to the voltage of the gate electrode G1 of the transistor T1 (i.e., the voltage of the second storage electrode E2 of the storage capacitor Cst). The driving current Id flows to the light emitting diode LED through the sixth transistor T6. The light emitting diode LED emits light as a current $I_{led}$ flows through the light emitting diode LED.

The seventh transistor T7 is responsible for initializing the anode of the light emitting diode LED. The gate electrode G7 of the seventh transistor T7 is connected to the bypass control line 158, a first electrode S7 of the seventh transistor T7 is connected to the anode of the light emitting diode LED, and a second electrode D7 of the seventh transistor T7 is connected to the initialization voltage line 127. According to one embodiment, the bypass control line 158 may be connected to the previous scan line 152. In this case, the bypass signal GB is applied with the signal of the same timing as the previous scan signal S(n−1). In another embodiment, the bypass control line 158 may not be connected to the previous scan line 152, and may transmit a signal that is different from the previous scan signal S(n−1). When the seventh transistor T7 turns on according to the bypass signal GB, the initialization voltage Vint is applied to the anode of the light emitting diode LED to place the light emitting diode LED in an initialized state.

A first storage electrode E1 of the storage capacitor Cst is connected to the driving voltage line 172, and the second storage electrode E2 is connected to the gate electrode G1 of the driving transistor T1, the second electrode D3 of the third transistor T3, and the second electrode D4 of the fourth transistor T4. As a result, the voltage charged at the storage capacitor Cst across the second storage electrode E2 and the first storage electrode E1 determines the voltage applied to the gate electrode G1 of the driving transistor T1. The second storage electrode E2 of the storage capacitor Cst receives the data voltage Dm through the second electrode D3 of the third transistor T3 or the initialization voltage Vint through the second electrode D4 of the fourth transistor T4.

On the other hand, the anode of the light emitting diode LED is connected to the second electrode D6 of the sixth transistor T6 and the first electrode S7 of the seventh transistor T7, and a cathode of the light emitting diode LED is connected to the common voltage line 741 transmitting the common voltage ELVSS.

In the exemplary embodiment of FIG. 14, the pixel PX includes seven transistors T1 to T7 and one capacitor Cst, but the present disclosure is not limited thereto, and the number of transistors, the number of capacitors, and their connections may be varied without deviating from the scope of the present disclosure.

Figure 15:
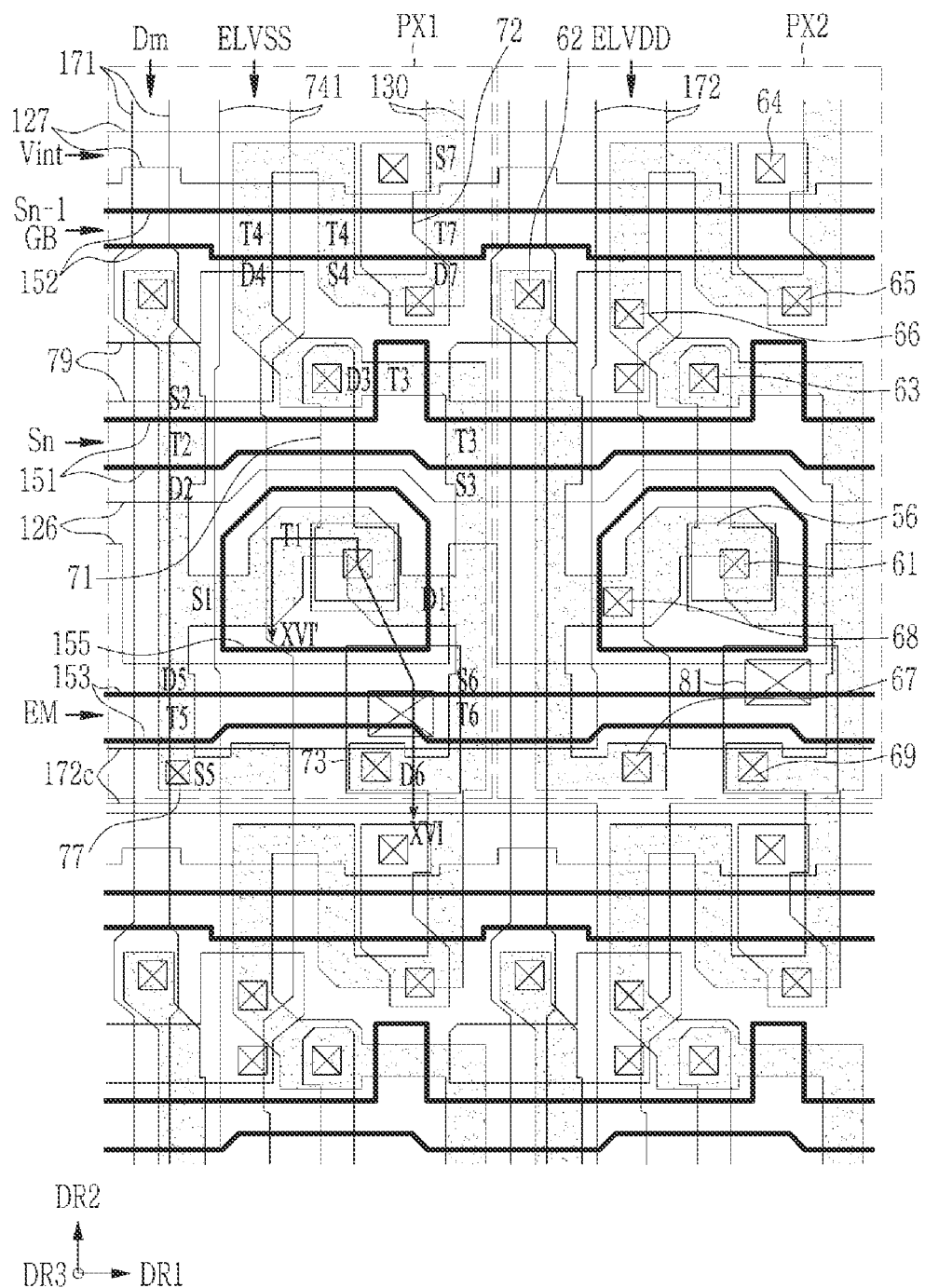
FIG. 15 is a layout view of a pixel area of a display device according to an exemplary embodiment.
Figure 16:
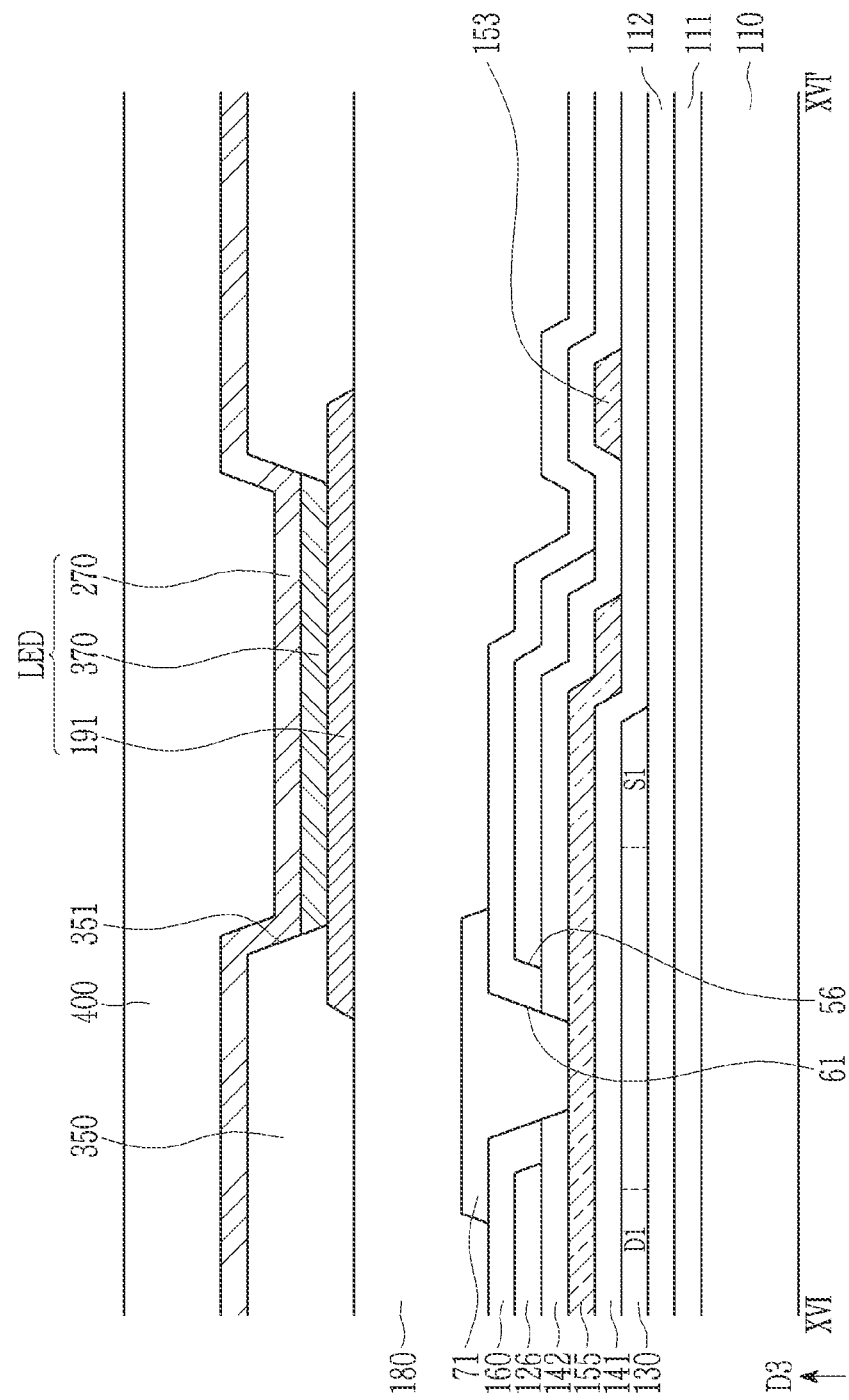
FIG. 16 is a cross-sectional view taken along a line XVI-XVI' of FIG. 15.

FIG. 15 is a layout view of a pixel area of a display device according to an exemplary embodiment, and FIG. 16 is a cross-sectional view taken along a line XVI-XVI' of FIG. 15.

Referring to FIG. 15, the display device according to an exemplary embodiment includes the scan line 151 that extends in the first direction DR1 and transmits the scan signal Sn, the previous scan line 152 transmitting the previous scan signal S(n−1), the light emission control line 153 transmitting the light emission control signal EM, and the initialization voltage line 127 transmitting the initialization voltage Vint. The bypass signal GB may be transmitted through the previous scan line 152.

The display device includes the data line 171 that extends along a second direction DR2 orthogonal to the first direction DR1 and transmits the data voltage Dm, and the common voltage line 741 transmitting the common voltage ELVSS. The first pixel PX1 shown in FIG. 15 and FIG. 16 corresponds to the pixel in which the driving voltage line 172 is replaced by the common voltage line 741 in FIG. 1 to FIG. 3. The driving voltage line 172 connected to the second pixel PX2 shown in FIG. 15 is not replaced with the common voltage line 741, and the conventional driving voltage line 172 is disposed. Hereinafter, the first pixel PX1 is described in comparison with the second pixel PX2.

The display device includes the driving transistor T1, the second transistor T2, the third transistor T3, the fourth transistor T4, the fifth transistor T5, the sixth transistor T6, the seventh transistor T7, the storage capacitor Cst, and the light emitting diode LED.

Substitute Specification-Clean Copy

Each channel of the driving transistor T1, the second transistor T2, the third transistor T3, the fourth transistor T4, the fifth transistor T5, the sixth transistor T6, and the seventh transistor T7 is disposed within a semiconductor layer 130. At least some of the first and second electrodes of the plurality of transistors T1, T2, T3, T4, T5, T6, and T7 are also disposed in the semiconductor layer 130. The semiconductor layer 130 (the portion where the shadow is added in FIG. 15) may be formed to bend into various shapes. The semiconductor layer 130 may include a polycrystalline semiconductor such as polysilicon, or an oxide semiconductor.

The semiconductor layer 130 includes a channel doped with an N-type impurity or a P-type impurity, and a first doping region and a second doping region that are positioned at respective sides of the channel and have a higher doping concentration than the channel. The first doping region and the second doping region may correspond to the first and second electrodes of the plurality of transistors T1, T2, T3, T4, T5, T6, and T7, respectively. If one of the first doping region and the second doping region is the source region, the other may be the drain region. In addition, in the semiconductor layer 130, a region (e.g., channel) between the first electrode and the second electrode of the different transistors may be doped such that the source electrode of one transistor and the drain electrode of the other transistor may be electrically connected to each other.

Each of the channels of the transistors T1, T2, T3, T4, T5, T6, and T7 overlaps the gate electrode of each of the transistors T1, T2, T3, T4, T1, T2, T3, T4, T5, T6, and T7, and is disposed between the first electrode and the second electrode of each of the transistors T1, T2, T3, T4, T5, T6, and T7. The plurality of transistors T1, T2, T3, T4, T5, T6, and T7 may have substantially the same stacked structure. Hereinafter, the driving transistor T1 is mainly described in detail, and the rest of the transistors T2 to T7 are schematically described. The driving transistor T1 includes a channel, a first gate electrode 155 (the gate electrode G1 shown in FIG. 14), the first electrode S1, and the second electrode D1. The channel of the driving transistor T1 disposed between the first electrode S1 and the second electrode D1 overlaps the first gate electrode 155 in a plan view. As illustrated in FIG. 15, the channel is curved in order to form a longer channel length within a limited region. As the length of the channel becomes longer, a driving range of a gate voltage Vg applied to the first gate electrode 155 of the driving transistor T1 is widened, and the driving current Id is constantly increased according to the gate voltage Vg. As a result, by varying the magnitude of the gate voltage Vg, the gray of the light emitted by the light emitting diode LED may be controlled more precisely, and the display quality of the display device may be improved. In addition, since the channel extends in several directions rather than extending in one direction, effects due to directionality are offset in a manufacturing process, thereby reducing an effect of process dispersion. Therefore, it is possible to prevent degradation in image quality such as spot defects (for example, non-uniform luminance occurring depending on pixels even if the same data voltage Dm is applied) from occurring due to the characteristic of the driving transistor T1 that may be varied according to the region of the display device due to the process dispersion. The shape of the channel is not limited to the illustrated f shape, and the channel may have various shapes.

The first gate electrode 155 overlaps the channel in a plan view. The first electrode S1 and the second electrode D2 are positioned at opposite sides of the channel. An extended portion of a storage line 126 is isolated and positioned on the first gate electrode 155. The extended portion of the storage line 126 overlaps the first gate electrode 155 with a second gate insulating layer therebetween in a plan view to form the storage capacitor Cst. The extended portion of the storage line 126 corresponds to the first storage electrode E1 of the storage capacitor Cst, and the first gate electrode 155 may correspond to the second storage electrode E2 of the storage capacitor Cst shown in FIG. 14. The extended portion of the storage line 126 is provided with an opening 56 so that the first gate electrode 155 may be connected to a first data connecting member 71. In the opening 56, an upper surface of the first gate electrode 155 and the first data connecting member 71 are electrically connected through an opening 61. The first data connecting member 71 is connected to the second electrode D3 of the third transistor T3 to connect the first gate electrode 155 of the driving transistor T1 and the second electrode D3 of the third transistor T3.

The gate electrode G2 of the second transistor T2 may correspond to a portion of the scan line 151. The data line 171 is connected to the first electrode S2 of the second transistor T2 through a contact hole 62. The first electrode S2 and the second electrode D2 of the second transistor T2 may be disposed on the semiconductor layer 130.

The third transistor T3 may be formed of two transistors that are adjacent to each other. In the pixel PX shown in FIG. 15, the third transistor T3 is shown to have a first portion extending to the and a second portion extending to the lower side with respect to a folded portion of the semiconductor layer 130. Each of these two portions plays the role of the third transistor T3, and has a structure in which the first electrode S3 of one of the two transistors is connected to the second electrode D3 of the other transistor. The gate electrodes of the two transistors may correspond to a portion of the scan line 151 or a portion protruded upwardly from the scan line 151. Such a structure may be referred to as a dual gate structure, and performs a role of preventing a leakage current. The first electrode S3 of the third transistor T3 is connected to the first electrode S6 of the sixth transistor T6 and the second electrode D1 of the driving transistor T1. The second electrode D3 of the third transistor T3 is connected to the first data connecting member 71 through a contact hole 63. The fourth transistor T4 includes two fourth transistors that are formed where the previous scan line 152 and the semiconductor layer 130 meet. The gate electrode G4 of the fourth transistor T4 may correspond to a portion of the previous scan line 152. There is a structure in which the first electrode S4 of one of the two transistors is connected to the second electrode D4 of the other transistor. Similar to the third transistor T3, the fourth transistor has a dual gate structure can prevent a leakage current. A second data connecting member 72 is connected to the first electrode S4 of the fourth transistor T4 through a contact hole 65, and the first data connecting member 71 is connected to the second electrode D4 of the fourth transistor T4 through the contact hole 63.

As above-described, the third transistor T3 and the fourth transistor T4 have the dual gate structure, therefore an electron moving path of their channel is blocked in an off state, thereby effectively preventing the leakage current.

The gate electrode G5 of the fifth transistor T5 may correspond to a portion of the light emission control line 153. The driving voltage line 172 is connected to the first electrode S5 of the fifth transistor T5 through a contact hole 77, and the second electrode D5 of the fifth transistor T5 is connected to the first electrode S1 of the driving transistor T1 through the semiconductor layer 130.

The first pixel PX1 receives the driving voltage ELVDD from the adjacent pixel PX2 through the driving voltage connection line 172c that is connected to the driving voltage line 172 of the adjacent pixel PX2 since the driving voltage line 172 connected to the pixel is replaced by the common voltage line 741.

However, in the second pixel PX2, the common voltage line 172 is connected to the first electrode S5 of the fifth transistor T5 through the contact hole 67, and the second electrode D5 of the fifth transistor T5 is connected to the first electrode S1 of the driving transistor T1 through the semiconductor layer 130.

The gate electrode G6 of the sixth transistor T6 may correspond to a portion of the light emission control line 153. A third data connecting member 73 is connected to the second electrode D6 of the sixth transistor T6 through a contact hole 69, and the first electrode S6 of the sixth transistor T6 is connected to the second electrode D1 of the driving transistor T1 through the semiconductor layer 130.

The gate electrode G7 of the seventh transistor T7 may correspond to a portion of the previous scan line 152. The first electrode S7 of the seventh transistor T7 is connected to the second electrode D6 of the sixth transistor T6, and the second electrode D7 of the seventh transistor T7 is connected to the first electrode S4 of the fourth transistor T4. The storage capacitor Cst includes the first storage electrode E1 and the second storage electrode E2 overlapping each other via a second gate insulating layer 142. The second storage electrode E2 of the storage capacitor Cst may correspond to the first gate electrode 155 of the driving transistor T1, and the first storage electrode E1 of the storage capacitor Cst may correspond to the extended portion of the storage line 126. Here, the second gate insulating layer 142 may be formed of a dielectric material, and the capacitance is determined by a charge charged in the storage capacitor Cst and the voltage between the first and second storage electrodes E1 and E2. By using the first gate electrode 155 of the driving transistor T1 as the second storage electrode E2 of the storage capacitor Cst, a space for forming the storage capacitor Cst can be secured in a space that is narrowed by the channel of the driving transistor T1 that occupies a large area within the pixel PX.

The first storage electrode E1 of the first pixel PX1 receives the driving voltage ELVDD through the driving voltage connection line 172c. Accordingly, the storage capacitor Cst stores a charge corresponding to the difference between the driving voltage ELVDD transmitted to the first storage electrode E1 through the driving voltage connection line 172c and the gate voltage Vg of the first gate electrode 155.

However, the driving voltage line 172 is connected to the first storage electrode E1 of the second pixel PX2 through a contact hole 68. Accordingly, the storage capacitor Cst of the second pixel PX2 stores a charge corresponding to the difference between the driving voltage ELVDD transmitted to the first storage electrode E1 through the driving voltage line 172 and the gate voltage Vg of the first gate electrode 155.

The second data connecting member 72 is connected to the initialization voltage line 127 through a contact hole 64. A first electrode (e.g., 191 shown in FIG. 16) is connected to the third data connecting member 73 through a contact hole 81. The first electrode may be a pixel electrode of the pixel PX.

A parasitic capacitor control pattern 79 may be formed between the dual gate electrodes of the third transistor T3. There may be a parasitic capacitor inside the pixel PX, and the image quality characteristic of the display device may deteriorate if the voltage applied to the parasitic capacitor changes. In the first pixel PX1 shown in FIG. 15, the common voltage line 741 is disposed instead of the driving voltage line 172, therefore the driving voltage line 172 and the parasitic capacitor control pattern 79 are connected. However, in the second pixel PX2, the parasitic capacitor control pattern 79 and the driving voltage line 172 are connected through a contact hole 66. As a result, it is possible to prevent the image quality characteristic from being deteriorated by applying the driving voltage ELVDD having a constant DC voltage to the parasitic capacitor. The parasitic capacitor control pattern 79 may be disposed in a region different from the region shown in FIG. 15. The parasitic capacitor control pattern 79 may be applied with a voltage other than the driving voltage ELVDD.

One terminal of the first data connecting member 71 is connected to the first gate electrode 155 of the driving transistor T1 through the contact hole 61, and the other terminal of the first data connecting member 71 is connected to the second electrode D3 of the third transistor T3 and the second electrode D4 of the fourth transistor T4 through the contact hole 63.

One terminal of the second data connecting member 72 is connected to the first electrode S4 of the fourth transistor T4 through the contact hole 65, and the other terminal of the second data connecting member 72 is connected to the initialization voltage line 127 through the contact hole 64.

The third data connecting member 73 is connected to the second electrode D6 of the sixth transistor T6 via the contact hole 69.

Hereinafter, the cross-sectional structures of the display device according to an exemplary embodiment are described in a stacked order with reference to FIG. 16 in addition to FIG. 15.

The display device according to an exemplary embodiment includes a first substrate 110.

The first substrate 110 may include a plastic layer and a barrier layer. In some embodiments, the plastic layer and the barrier layer may be alternately stacked.

The plastic layer may include one selected from a group including polyether sulfone (PES), polyacrylate (PAR), polyetherimide (PEI), polyethylene naphthalate (PEN), poly (ethylene terephthalate) (PET), polyphenylene sulfide (PPS), polyarylate, polyimide (PI), polycarbonate (PC), poly (arylene ether sulfone), and any combinations thereof.

The barrier layer may include at least one of a silicon oxide, a silicon nitride, and an aluminum oxide. The barrier layer may include any inorganic material without being limited thereto.

A buffer layer 112 is disposed on the first substrate 110. The buffer layer 112 may include an inorganic insulating material such as a silicon oxide, a silicon nitride, and an aluminum oxide, or an organic insulating material such as a polyimide acryl.

The semiconductor layer 130 including the channel, the first electrode, and the second electrode of each of the plurality of transistors T1, T2, T3, T4, T5, T6, and T7 is disposed on the buffer layer 112.

A first gate insulating layer 141 is disposed on the semiconductor layer 130 covering the semiconductor layer 130. A first gate conductor layer including the first gate electrode 155, the scan line 151, the previous scan line 152, and the light emission control line 153 is disposed on the first gate insulating layer 141.

The second gate insulating layer 142 is disposed on the first gate conductor layer covering the first gate conductor layer. The first gate insulating layer 141 and the second gate insulating layer 142 may include an inorganic insulating material such as a silicon nitride, a silicon oxide, and an aluminum oxide, and the organic insulating material.

A second gate conductor layer including the storage line 126, the initialization voltage line 127, and the parasitic capacitor control pattern 79 is disposed on the second gate insulating layer 142.

An interlayer insulating layer 160 is disposed on the second gate conductor layer covering the second gate conductor layer. The interlayer insulating layer 160 may include an inorganic insulating material such as a silicon nitride, a silicon oxide, and an aluminum oxide, and may include the organic insulating material.

A data conductor layer including the data line 171, the driving voltage line 172, the first data connecting member 71, the second data connecting member 72, and the third data connecting member 73 is disposed on the interlayer insulating layer 160. The first data connecting member 71 may be connected to the first gate electrode 155 through the contact hole 61.

A passivation layer 180 is disposed on the data conductor layer covering the data conductor layer. The passivation layer 180 may be a planarization layer, and may include an organic insulating material or an inorganic insulating material.

A first electrode 191 is disposed on the passivation layer 180. The first electrode 191 is connected to the third data connecting member 73 via the contact hole 81 formed in the passivation layer 180.

A partition layer 350 is disposed on the passivation layer 180 and the first electrode 191. The partition layer 350 has openings 351 overlapping the first electrode 191. An emission layer 370 is disposed in the openings 351. A second electrode 270 is disposed on the emission layer 370 and the partition 350 layer. The first electrode 191, the emission layer 370, and the second electrode 270 may form the light emitting diode (a light-emitting element) LED. The first electrode 191 may be the pixel electrode, and the second electrode 270 may be the common electrode.

According to an exemplary embodiment, the pixel electrode may be an anode that is a hole injection electrode, and the common electrode may be a cathode that is an electron injection electrode. Conversely, the pixel electrode may be a cathode, and the common electrode may be an anode. When holes and electrons are injected from the pixel electrode and the common electrode into the emission layer 370, an exciton, in which the holes and electrons are combined, is emitted when being dropped from an excited state to a ground state.

An encapsulation layer 400 protecting the light-emitting element LED is disposed on the second electrode 270. The encapsulation layer 400 may be in contact with the second electrode 270 as shown, or may be spaced apart from the second electrode 270 according to another exemplary embodiment.

The encapsulation layer 400 may be a thin film encapsulation layer in which an inorganic film and an organic film are stacked, and may include a triple layer including the inorganic film, the organic film, and the inorganic film. According to an exemplary embodiment, a capping layer and/or a functional layer may be disposed between the second electrode 270 and the encapsulation layer 400.

Figure 17:
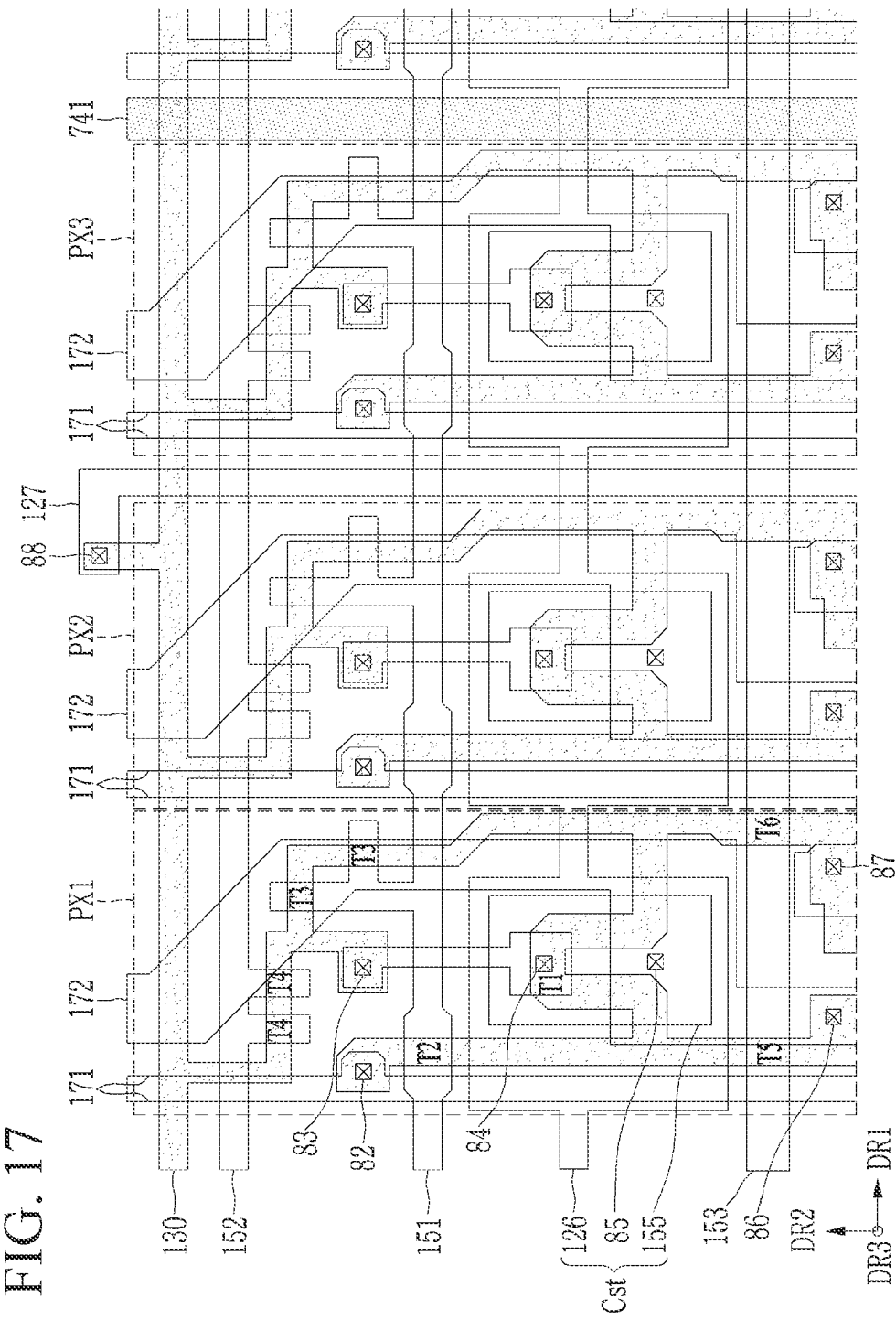
FIG. 17 is a layout view of a pixel area of a display device according to an exemplary embodiment.

FIG. 17 is a layout view of a pixel area of a display device according to an exemplary embodiment. Referring to FIG. 17, the display device includes a plurality of signal lines 127, 151, 152, 153, 171, 172, and 741. The plurality of signal lines may include the scan line 151 that is disposed in the first direction DR1, the previous scan line 152, the light emission control line 153, the data line 171 that are disposed in the second direction DR2, the driving voltage line 172, the initialization voltage line 127, and the common voltage line 741.

The display device incudes the driving transistor T1, the second transistor T2, the third transistor T3, the fourth transistor T4, the fifth transistor T5, the sixth transistor T6, and the storage capacitor Cst.

Each channel of the driving transistor T1, the second transistor T2, the third transistor T3, the fourth transistor T4, the fifth transistor T5, the sixth transistor T6 is disposed within the semiconductor layer 130. At least a portion of the first electrode and the second electrode of the plurality of transistors T1, T2, T3, T4, T5, and T6 may be disposed in the semiconductor layer 130.

Each of the signal lines and the semiconductor layer 130 are connected through a plurality of contact holes 82, 83, 84, 85, 86, 87, and 88.

Each transistor and the plurality of signal lines are similar to those shown in FIG. 15, and the detailed description of the same constituent elements is omitted.

Referring to FIG. 17, the common voltage line 741 is disposed outside the region of the pixels PX1, PX2, and PX3. Referring to the display device shown in FIG. 15, the driving voltage line 172 of the partial pixel PX1 is replaced by the common voltage line 741, and the corresponding pixel PX1 receives the driving voltage ELVDD from the adjacent pixel through the driving voltage connection line 172c.

Referring back to the display device shown in FIG. 17, the common voltage line 741 is separately disposed outside the regions of the pixels PX1, PX2, and PX3. Therefore, the common voltage line 741 may be placed without removing any of the conventional driving voltage line 172 of the pixels PX1, PX2, and PX3.

That is, FIG. 15 corresponds to the exemplary embodiment of FIGS. 1 to 3, FIG. 7, and FIG. 8 described above, and FIG. 17 corresponds to the exemplary embodiment of FIGS. 4 to 6, FIG. 9, and FIG. 10 described above.

FIG. 17 is also different from FIG. 15 in that the initialization voltage line 127 is disposed in the second direction DR2, not the first direction DR1. The initialization voltage line 127 may also be disposed in the region between the neighboring pixels PX1, PX2, and PX3.

While the present disclosure has been described in connection with what is presently considered to be practical exemplary embodiments, it is to be understood that the present disclosure is not limited to the exemplary embodiments. On the contrary, it is intended to cover various modifications and equivalent arrangements included within the spirit and scope of the appended claims.

What is claimed is:

1. A display device comprising:
a substrate including a display area and a non-display area;
an external common voltage line, an external initialization voltage line, and an external driving voltage line disposed in the non-display area;
a plurality of pixels and a common voltage line disposed in the display area; and
a driving voltage line connected to each of the plurality of pixels,
wherein a subset of the plurality of pixels overlaps the common voltage line in the display area in a plan view,
the external common voltage line and the common voltage line are connected to each other, and
each of the external initialization voltage line, the external driving voltage line, and the external common voltage line includes a plurality of portions that are separated from each other.

2. The display device of claim 1, wherein
the driving voltage line is indirectly connected to the subset of the plurality of pixels via a driving voltage connection line.

3. The display device of claim 1, wherein
the external common voltage line is disposed to surround four edges of the display area.

4. The display device of claim 1, wherein
the common voltage line further includes a transverse common voltage line and a longitudinal common voltage line.

5. The display device of claim 1, wherein
the external common voltage line is divided via the display area.

6. The display device of claim 1, wherein each of the external initialization voltage line, the external driving voltage line, and the external common voltage line has a multi-layered structure.

7. The display device of claim 6, wherein
each of the external initialization voltage line, the external driving voltage line, and the external common voltage line includes a first layer and a second layer,
the first layer is a same layer as a first source/drain layer of the display area, and
the second layer is a same layer as a second source/drain layer of the display area.

8. The display device of claim 1, further comprising
an initialization voltage line disposed in the display area,
wherein the external initialization voltage line and the initialization voltage line are connected to each other.

9. The display device of claim 1, wherein
the connecting member is disposed on a same layer as a gate line, a data line, or a pixel electrode in the display area.

10. The display device of claim 9, wherein
the connecting member includes a first connecting member disposed on a same layer as the gate line and a second connecting member disposed on a same layer as the pixel electrode, and the first connecting member and the second connecting member overlap each other in the plan view.

11. A display device comprising:
a substrate including a display area and a non-display area;
an external common voltage line, an external initialization voltage line and an external driving voltage line disposed in the non-display area;
a plurality of pixels and a plurality of common voltage lines disposed in the display area; and
a driving voltage line connected to each of the plurality of pixels,
wherein the external common voltage line and the plurality of common voltage lines are connected to each other, and
each of the external initialization voltage line, the external driving voltage line, and the external common voltage line includes a plurality of portions that are separated from each other.

12. The display device of claim 11, wherein
the external common voltage line is disposed to surround four edges of the display area.

13. The display device of claim 11, wherein
the plurality of common voltage lines and the driving voltage line are disposed on a same layer.

14. The display device of claim 11, wherein
each of the plurality of common voltage lines further includes a transverse common voltage line and a longitudinal common voltage line.

15. The display device of claim 14, wherein
the plurality of common voltage lines are disposed farther from the substrate than the driving voltage line, and
an insulating layer is disposed between the plurality of common voltage lines and the driving voltage line.

16. The display device of claim 11, wherein
the external common voltage line is divided via the display area.

17. The display device of claim 11, wherein each of the external initialization voltage line, the external driving voltage line, and the external common voltage line has a multi-layered structure.

18. The display device of claim 11, further comprising
an initialization voltage line disposed in the display area,
wherein the external initialization voltage line and the initialization voltage line are connected to each other.

19. The display device of claim 11, wherein each of the external initialization voltage line, the external driving voltage line, and the external common voltage line includes a first layer and a second layer,
the first layer is a same layer as a first source/drain layer of the display area, and
the second layer is a same layer as a second source/drain layer of the display area.

20. The display device of claim 11, wherein
the connecting member is disposed on a same layer as a gate line, a data line, or a pixel electrode in the display area.

21. A display device comprising:
a substrate including a display area and a non-display area;
an external voltage line disposed in the non-display area; and
a plurality of pixels and a voltage line disposed in the display area, the voltage line connected to each of the plurality of pixels,
wherein a subset of the plurality of pixels overlaps the voltage line in the display area in a plan view,
the external voltage line and the voltage line are connected to each other, and
the external voltage line includes a plurality of portions that are separated from each other.

* * * * *